US009087904B2

(12) United States Patent
Kishida et al.

(10) Patent No.: US 9,087,904 B2
(45) Date of Patent: Jul. 21, 2015

(54) THIN-FILM TRANSISTOR HAVING TAPERED ORGANIC ETCH-STOPPER LAYER

(71) Applicant: JOLED INC., Tokyo (JP)

(72) Inventors: Yuji Kishida, Hyogo (JP); Eiichi Satoh, Hyogo (JP); Takahiro Kawashima, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/236,698

(22) PCT Filed: May 29, 2013

(86) PCT No.: PCT/JP2013/003403
§ 371 (c)(1),
(2) Date: Feb. 3, 2014

(87) PCT Pub. No.: WO2013/183255
PCT Pub. Date: Dec. 12, 2013

(65) Prior Publication Data
US 2014/0167165 A1     Jun. 19, 2014

(30) Foreign Application Priority Data

Jun. 8, 2012 (JP) ................................. 2012-130813

(51) Int. Cl.
*H01L 29/786* (2006.01)
*H01L 29/66* (2006.01)
(Continued)

(52) U.S. Cl.
CPC ........ *H01L 29/786* (2013.01); *H01L 21/76829* (2013.01); *H01L 27/1248* (2013.01); *H01L 29/66742* (2013.01); *H01L 29/66765* (2013.01); *H01L 27/3262* (2013.01)

(58) Field of Classification Search
CPC ............ H01L 29/786; H01L 29/66742; H01L 29/66765; H01L 27/1248; H01L 21/76829
See application file for complete search history.

(56) References Cited

U.S. PATENT DOCUMENTS 5,286,659 A * 2/1994 Mitani et al. .................... 438/30
5,474,941 A * 12/1995 Mitani et al. .................. 438/151
(Continued)

FOREIGN PATENT DOCUMENTS

| JP | 10-189499 | 7/1998 |
| JP | 10-209458 | 8/1998 |

(Continued)

OTHER PUBLICATIONS

U.S. Appl. No. 14/130,941 to Yuji Kishida et al., filed Jan. 6, 2014.
(Continued)

*Primary Examiner* — Kevin Parendo
(74) *Attorney, Agent, or Firm* — Greenblum & Bernstein, P.L.C.

(57) ABSTRACT

A thin-film transistor includes: a gate electrode above a substrate; a gate insulating layer above the gate electrode; a semiconductor layer opposed to the gate electrode with the gate insulating layer therebetween; a protective layer above the semiconductor layer and comprising an organic material; and a source electrode and a drain electrode each of which has at least a portion located above the protective layer. The protective layer includes an altered layer which has at least a portion contacting the semiconductor layer, and which is generated by alteration of a surface layer of the protective layer in a region exposed from the source electrode and the drain electrode. A relational expression of $\text{Log}_{10} Nt \leq 0.0556\theta + 16.86$ is satisfied where $Nt$ (cm$^{-3}$) represents a defect density of the semiconductor layer and $\theta$ (°) represents a taper angle of an edge portion of the protective layer.

11 Claims, 18 Drawing Sheets

(51) Int. Cl.
*H01L 27/12* (2006.01)
*H01L 21/768* (2006.01)
*H01L 27/32* (2006.01)

(56) References Cited

U.S. PATENT DOCUMENTS

| | | |
|---|---|---|
| 7,768,009 B2 | 8/2010 | Kobayashi et al. |
| 7,791,075 B2 | 9/2010 | Kobayashi et al. |
| 8,133,771 B2 | 3/2012 | Kobayashi et al. |
| 8,389,993 B2 | 3/2013 | Kobayashi et al. |
| 8,420,462 B2 | 4/2013 | Kobayashi et al. |
| 8,513,661 B2 | 8/2013 | Takahashi et al. |
| 2005/0230686 A1* | 10/2005 | Kojima et al. .................. 257/77 |
| 2009/0057672 A1 | 3/2009 | Kobayashi et al. |
| 2009/0065784 A1 | 3/2009 | Kobayashi et al. |
| 2010/0244022 A1 | 9/2010 | Takahashi et al. |
| 2010/0285624 A1 | 11/2010 | Kobayashi et al. |
| 2010/0304515 A1 | 12/2010 | Kobayashi et al. |
| 2012/0129288 A1 | 5/2012 | Kobayashi et al. |
| 2012/0262642 A1* | 10/2012 | Ikeda et al. ..................... 349/46 |
| 2013/0001559 A1 | 1/2013 | Kishida et al. |

FOREIGN PATENT DOCUMENTS

| | | |
|---|---|---|
| JP | 2002-261287 | 9/2002 |
| JP | 2004-038047 | 2/2004 |
| JP | 2009-076894 | 4/2009 |
| JP | 2009-081425 | 4/2009 |
| JP | 2009-176865 | 8/2009 |
| WO | 2011/037102 | 3/2011 |

OTHER PUBLICATIONS

U.S. Appl. No. 14/130,939 to Yuji Kishida et al., filed Jan. 6, 2014.
International Search Report (ISR) in International Patent Application No. PCT/JP2013/003403, dated Jul. 2, 2013.

* cited by examiner (a) (b)

(a) (b)

(a) (b)

[Conventional example]

Drain Current Ids (a.u.)

Gate Voltage Vgs (a.u.)

Drain Current Ids [A]

Characteristics of conventional thin-film transistor
Hump phenomenon
Parasitic transistor
Main transistor Gate Voltage Vgs [V]

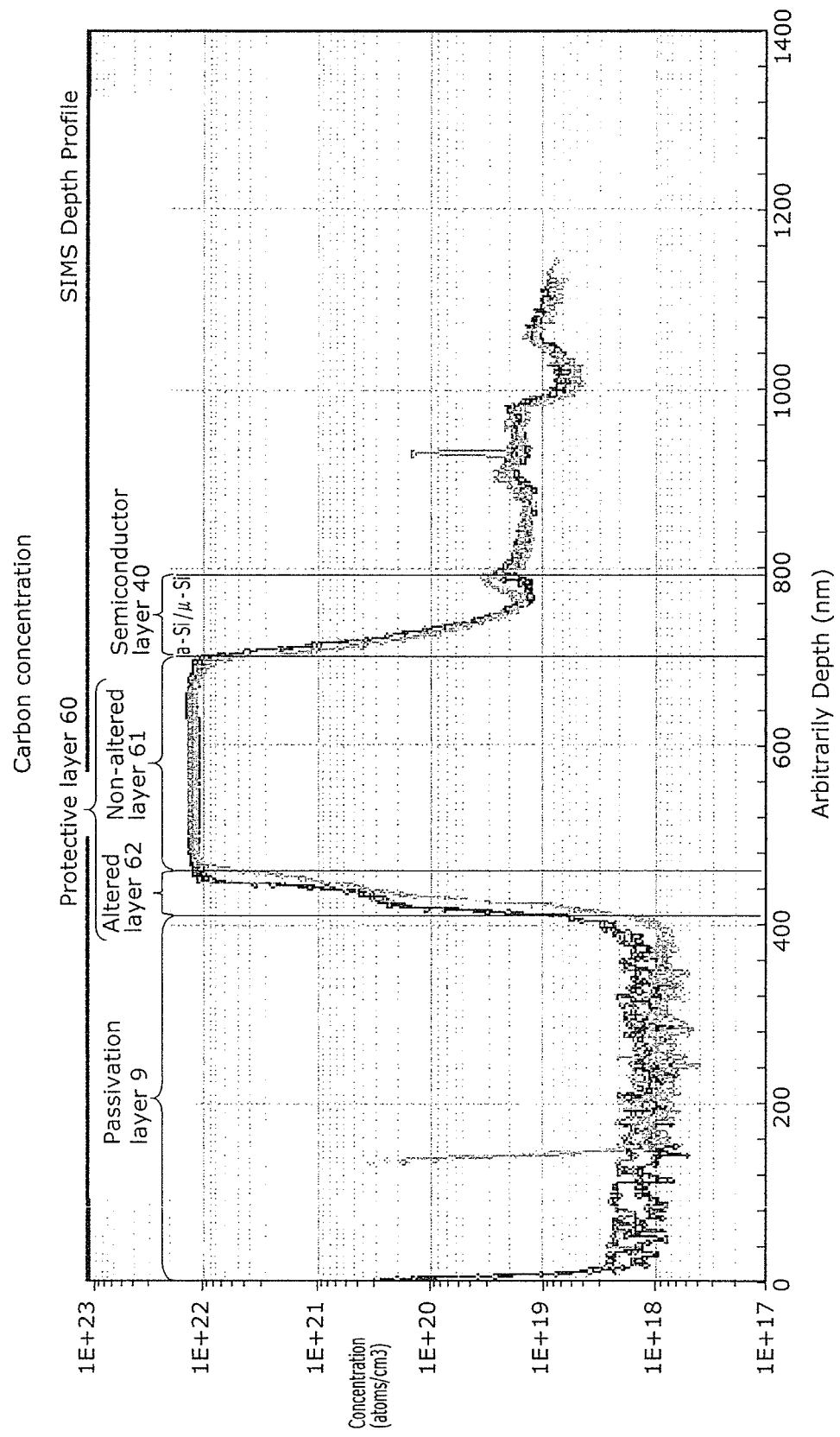

(a)

(b)

THIN-FILM TRANSISTOR HAVING TAPERED ORGANIC ETCH-STOPPER LAYER

TECHNICAL FIELD

The present invention relates to thin-film transistors and methods for manufacturing the thin-film transistors, and particularly to a thin-film transistor including an etch-stopper layer comprising organic application materials, and a method for manufacturing the thin-film transistor.

BACKGROUND ART

In recent years, organic EL displays using electroluminescence (EL) of an organic material have been attracting attention as a type of next-generation flat panel display replacing liquid crystal displays. In an active-matrix display device such as the organic EL display, a thin-film semiconductor device referred to as a thin-film transistor (TFT) is used.

Unlike the voltage-driven liquid crystal display, the organic EL display is a current-driven display device. Accordingly, there is an urgent need for development of a thin-film transistor having excellent turn-on/off characteristics as a driving circuit for the active-matrix display device. The thin-film transistor includes a gate electrode, an insulating layer, a semiconductor layer (channel layer), a source electrode, and a drain electrode formed above a substrate. Generally, a silicon thin-film is used as the channel layer.

Increased size and reduced cost are also required for the display device, and a bottom-gate thin-film transistor in which a gate electrode is formed on a side close to the substrate with respect to the channel layer is generally used as a thin-film transistor which allows cost reduction easily.

The bottom-gate thin-film transistor is generally divided into two types; namely, a channel etching thin-film transistor which includes an etched channel layer, and an etch-stopper (channel protective) thin-film transistor in which the channel layer is protected from etching.

Compared to the etch-stopper thin-film transistor, the channel etching thin-film transistor has advantages in the reduced number of photolithography process and a lower manufacturing cost.

In contrast, with the etch-stopper thin-film transistor, it is possible to prevent the damage on the channel layer by etching, suppressing an increase in the variation of characteristics within a surface of the substrate. Furthermore, the channel layer of the etch-stopper thin-film transistor can be thinner than the channel layer of the channel etching thin-film transistor. Accordingly, parasitic resistance component can be reduced and the turn-on characteristics can be improved, which are advantageous for increasing definition.

Therefore, the etch-stopper thin-film transistor is suitable for a driving transistor in the current-driven organic EL display device using an organic EL element, for example, and there are attempts to use the etch-stopper thin-film transistor in a pixel circuit in the organic EL display device even if the manufacturing cost is higher than the manufacturing cost when the channel-etching thin-film transistor is used.

For example, patent literature 1 discloses an etch-stopper TFT in which a microcrystalline semiconductor film is used as a channel layer, and an etch-stopper layer is formed above a channel layer with a buffer layer provided in between.

CITATION LIST

Patent Literature

[PTL 1]
Japanese Unexamined Patent Application Publication No. 2009-76894

SUMMARY OF INVENTION

Technical Problem

However, use of organic materials for the etch-stopper layer in the etch-stopper thin-film transistor causes a marked hump referred to as hump phenomenon in the transistor characteristics (I-V characteristics).

In particular, such marked hump phenomenon appears in a region in which current of the transistor characteristics rapidly increases. The region in which current rapidly increases corresponds to a low gray scale region, that is, a black display region in a display device. Unlike the liquid crystal display, the characteristics in the black display region are important for the organic EL display.

The present invention has been conceived to solve the above problem, and has an object to provide (i) an etch-stopper thin-film transistor, including an etch-stopper layer comprising organic materials, with reduced hump phenomenon and (ii) a method for manufacturing the thin-film transistor.

Solution to Problem

In order to achieve the object, the thin-film transistor according to an aspect of the present invention includes: a gate electrode above a substrate; a gate insulating layer above the gate electrode; a semiconductor layer that is opposed to the gate electrode with the gate insulating layer therebetween; an etch-stopper layer above the semiconductor layer and comprising an organic material; and a source electrode and a drain electrode that are opposed to each other, each of the source electrode and the drain electrode having at least a portion located above the etch-stopper layer. In the etch-stopper layer includes an altered layer having at least a portion contacting the semiconductor layer, the altered layer being generated by alteration of a surface layer of the etch-stopper layer in a region exposed from the source electrode and the drain electrode, and a relational expression of $\text{Log}_{10} Nt \leq 0.0556\theta + 16.86$ is satisfied where $Nt$ ($\text{cm}^{-3}$) represents a defect density of the semiconductor layer and $\theta$ (°) represents a taper angle of an edge portion of the region of the etch-stopper layer exposed from the source electrode and the drain electrode.

Advantageous Effects of Invention

According to an aspect of the present invention, it is possible to provide a thin-film transistor with excellent transistor characteristics, in particular, where hump phenomenon is reduced in a region in which current rapidly increases.

BRIEF DESCRIPTION OF DRAWINGS

In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

FIG. 7B shows concentration distribution of carbon in the films of the thin-film transistor shown in FIG. 1.

In FIG. 12, (a) shows a cross-sectional view of the thin-film transistor taken along line A-A' in (b), and (b) shows a perspective plan view of the thin-film transistor.

DESCRIPTION OF EMBODIMENTS

Figure 1:
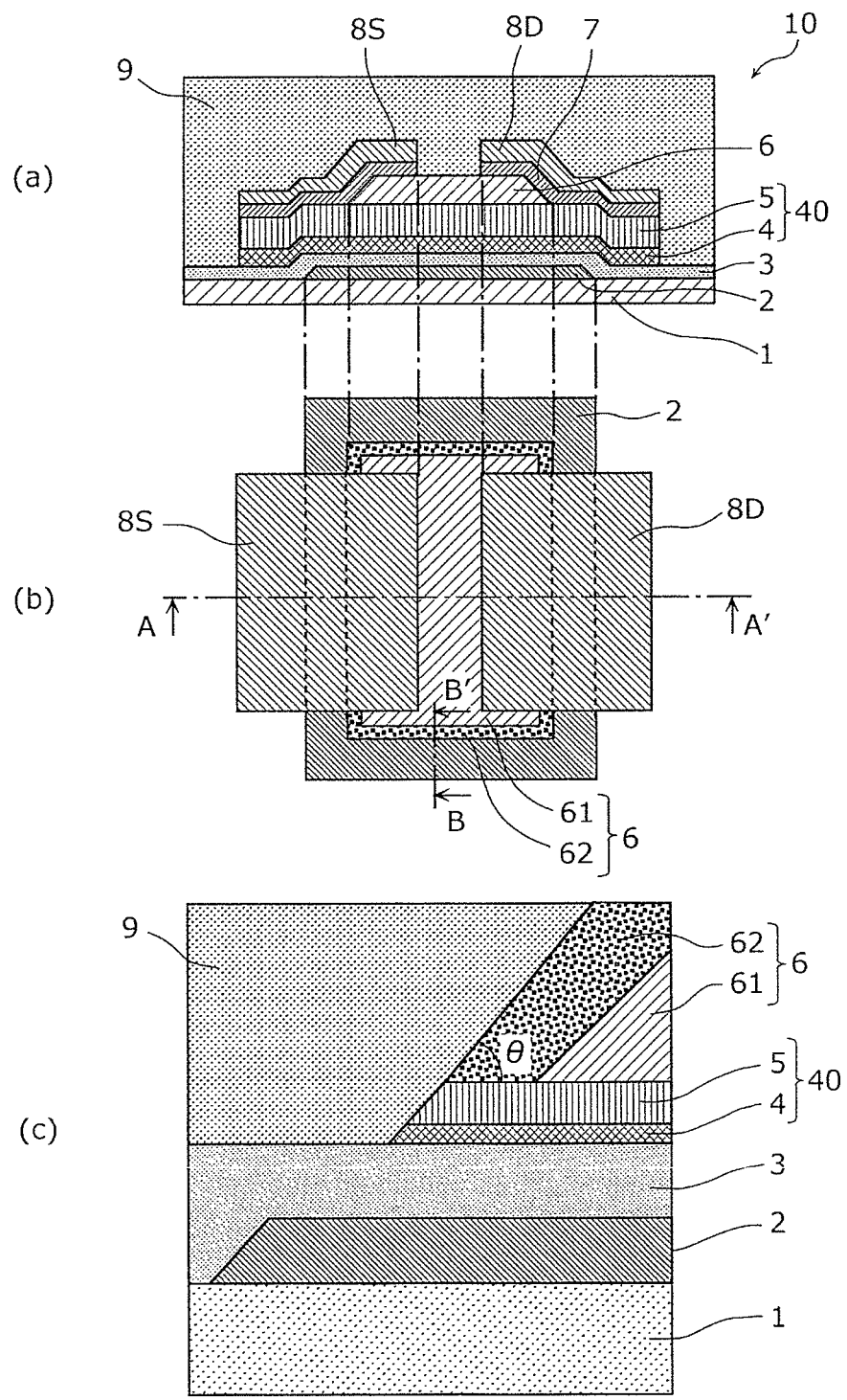
FIG. 1 schematically shows a configuration of a thin-film transistor according to an embodiment of the present invention.

The thin-film transistor according to an aspect of the present invention includes: a gate electrode above a substrate; a gate insulating layer above the gate electrode; a semiconductor layer that is opposed to the gate electrode with the gate insulating layer therebetween; an etch-stopper layer above the semiconductor layer and comprising an organic material; and a source electrode and a drain electrode that are opposed to each other, each of the source electrode and the drain electrode having at least a portion located above the etch-stopper layer. The etch-stopper layer includes an altered layer having at least a portion contacting the semiconductor layer, the altered layer being generated by alteration of a surface layer of the etch-stopper layer in a region exposed from the source electrode and the drain electrode, and a relational expression of $\mathrm{Log}_{10}$ Nt≤0.0556θ+16.86 is satisfied where Nt (cm$^{-3}$) represents a defect density of the semiconductor layer and θ (°) represents a taper angle of an edge portion of the region of the etch-stopper layer exposed from the source electrode and the drain electrode.

According to the aspect, the defect density (Nt) of the semiconductor layer and the taper angle (θ) at the edge portion of the etch-stopper layer including the altered layer satisfy the relational expression of $\mathrm{Log}_{10}$ Nt≤0.0556θ+16.86. This reduces occurrence of the hump phenomenon.

Furthermore, it may be that in the thin-film transistor according to an aspect of the present invention, the altered layer is a layer generated by dry etching performed to pattern the semiconductor layer.

The altered layer generated by dry etching performed to pattern the semiconductor layer includes a large amount of fixed charges, which causes the hump phenomenon. By satisfying the above relational expression, occurrence of the hump phenomenon can be reduced.

Furthermore, in the thin-film transistor according to an aspect of the present invention, it may be that the altered layer has a thickness of at least 30 nm. Furthermore, in the thin-film transistor according to an aspect of the present invention, it may be that the altered layer has a density higher than a density of a non-altered layer which is a portion of the etch-stopper layer that is not altered by the dry etching. Furthermore, in the thin-film transistor according to an aspect of the present invention, it may be that the altered layer has a chlorine concentration which is at least ten times higher than a chlorine concentration of the non-altered layer. Furthermore, in the thin-film transistor according to an aspect of the present invention, it may be that the altered layer has a carbon concentration which is at most one hundredth of a carbon concentration of the non-altered layer. However, the carbon concentration significantly varies depending on materials. Hence, the carbon concentration in the altered layer may exceed 1/100 of the carbon concentration in the etch-stopper layer.

Such configurations allow the altered layer in the etch-stopper layer to be identified. The altered layer includes a large amount of fixed charges, which causes the hump phenomenon. By satisfying the relational expression, occurrence of the hump phenomenon can be reduced.

Furthermore, the method for manufacturing the thin-film transistor according to an aspect of the present invention includes: preparing a substrate; forming a gate electrode above the substrate; forming a gate insulating layer above the gate electrode; forming a semiconductor film above the gate insulating layer; forming, above the semiconductor film, an etch-stopper layer comprising an organic material; forming a source electrode and a drain electrode that are opposed to each other, each of the source electrode and the drain electrode having at least a portion located above the etch-stopper layer; and forming a semiconductor layer patterned, by performing dry etching on the semiconductor film. In the forming of a semiconductor layer, the dry etching (i) alters, into an altered layer, a surface layer of the etch-stopper layer in a region exposed from the source electrode and the drain electrode and (ii) etches the etch-stopper layer to have a taper angle at an edge portion of the exposed region, and a relational expression of $\text{Log}_{10}\ Nt \leq 0.0556\theta + 16.86$ is satisfied where Nt (cm$^{-3}$) represents a defect density of the semiconductor layer and θ (°) represents the taper angle.

According to the aspect, the semiconductor layer and the etch-stopper layer are formed such that the defect density (Nt) of the semiconductor layer and the taper angle (θ) at the edge portion of the etch-stopper layer including the altered layer satisfy the relational expression of $\text{Log}_{10}\ Nt \leq 0.0556\theta + 16.86$. With this, it is possible to achieve a thin-film transistor with reduced hump phenomenon.

Furthermore, in the thin-film transistor according to an aspect of the present invention, it may be that the altered layer has a thickness of at least 30 nm. Furthermore, in the method for manufacturing the thin-film transistor according to an aspect of the present invention, it may be that the altered layer has a density higher than a density of a portion of the etch-stopper layer that is not altered by the dry etching. Furthermore, in the method for manufacturing the thin-film transistor according to an aspect of the present invention, it may be that the altered layer has a chlorine concentration which is at least ten times higher than a chlorine concentration of the non-altered layer. Furthermore, in the method for manufacturing the thin-film transistor according to an aspect of the present invention, it may be that the altered layer has a carbon concentration which is at most one hundredth of a carbon concentration of the non-altered layer.

Such configurations allow the altered layer in the etch-stopper layer to be identified. The altered layer includes a large amount of fixed charges, which causes the hump phenomenon. By satisfying the relational expression, occurrence of the hump phenomenon can be reduced.

(Embodiment)

The following shall describe a thin-film transistor and a method for manufacturing the thin-film transistor according to an embodiment of the present invention, with reference to the drawings. The exemplary embodiment described below shows a preferred specific example. The numerical values, shapes, materials, structural elements, the arrangement and connection of the structural elements, steps, the processing order of the steps etc. shown in the following exemplary embodiment are mere examples, and therefore do not limit the scope of the present invention. Therefore, among the structural elements in the following exemplary embodiment, structural elements not recited in any one of the independent claims are not necessarily required to achieve the object of the present invention, but are described as more preferable implementations.

Furthermore, in each of the drawings, substantially same structural elements are assigned with the same referential numerals. Note that each figure is a schematic diagram, and is not necessarily accurate.

FIG. 1 schematically shows a configuration of a thin-film transistor according to the embodiment of the present invention. In FIG. 1, (a) shows a cross-sectional view of the thin-film transistor taken along line A-A' in (b), (b) shows a perspective plan view of the thin-film transistor, and (c) shows an enlarged cross-sectional view of the thin-film transistor taken along line B-B' in (b).

As shown in FIG. 1, a thin-film transistor 10 according to this embodiment is a channel protective bottom-gate thin-film transistor, and includes: a substrate 1; a gate electrode 2 on the substrate 1; a gate insulating layer 3 on the gate electrode 2; a semiconductor layer 40 that is opposed to the gate electrode 2 with the gate insulating layer 3 therebetween; a protective layer 6 on the semiconductor layer 40; and a source electrode 8S and a drain electrode 8D each of which has at least a portion located above the protective layer 6.

The thin-film transistor 10 according to this embodiment further includes a pair of contact layers 7 and a passivation layer 9. Each of the contact layers 7 has at least a portion located on the protective layer 6, and is formed between (i) the semiconductor layer 40 and (ii) the source electrode 8S or the drain electrode 8D.

The semiconductor layer 40 is patterned into an island shape above the substrate 1, and includes stacked films of: a crystalline silicon semiconductor layer 4 serving as a first semiconductor layer that is a lower layer; and an amorphous silicon semiconductor layer 5 serving as a second semiconductor layer that is an upper layer. The semiconductor layer 40 is opposed to the gate electrode 2 with the gate insulating layer 3 therebetween.

The thin-film transistor 10 satisfies the relational expression of $\text{Log}_{10}\ Nt \leq 0.0556\theta + 16.86$ where Nt (cm$^{-3}$) represents the defect density of the semiconductor layer 40 and θ (°) represents the taper angle at the edge portion of the protective layer 6. The thin-film transistor 10 according to this embodiment is an n-channel TFT.

The following shall specifically describe elements of the thin-film transistor 10 according to this embodiment.

The substrate 1 is a glass substrate comprising, for example, a glass material such as silica glass, alkali-free glass, or highly heat-resistant glass. An undercoat layer comprising silicon nitride ($SiN_x$), silicon oxide ($SiO_y$), silicon oxynitride ($SiO_yN_x$), or others may be formed on the substrate 1 in order to prevent impurities such as sodium and phosphorus in the glass substrate from entering the semiconductor layer 40. In addition, the undercoat layer also functions as a layer for buffering the heat on the substrate 1 in a high-temperature thermal treatment process such as laser annealing. The thickness of the undercoat layer is, for example, approximately 100 nm to 2000 nm.

The gate electrode 2 is formed on the substrate 1 in a predetermined shape. The gate electrode 2 has a single-layer structure or a multi-layer structure that comprises a conductive material which withstands melting-point temperature of silicon, an alloy including the materials, or the like. Examples of the materials of the gate electrode 2 include molybdenum (Mo), aluminum (Al), copper (Cu), tungsten (W), tantalum (Ta), niobium (Nb), nickel (Ni), titanium (Ti), chromium (Cr), or molybdenum-tungsten (MoW). The thickness of the gate electrode 2 is, for example, approximately 20 nm to 500 nm.

The gate insulating layer 3 (gate insulating film) is formed above the substrate 1. In this embodiment, the gate insulating layer 3 is formed on the entire surface of the substrate 1 covering the gate electrode 2. The gate insulating layer 3 may comprise, for example, silicon oxide ($SiO_y$), silicon nitride ($SiN_x$), silicon oxynitride ($SiO_yN_x$), aluminum oxide ($AlO_z$), or tantalum oxide ($TaO_w$), or may be made of a stacked film of the materials. The thickness of the gate electrode 3 is, for example, approximately 50 nm to 300 nm.

In this embodiment, the crystalline silicon semiconductor layer 4 serves as the semiconductor layer 40. Accordingly, at least silicon oxide is used for the gate insulating layer 3, for example. The reason is that it is preferable to have good interface state between the semiconductor layer 40 and the gate insulating layer 3 for maintaining excellent threshold voltage characteristics of the TFT, and silicon oxide is suitable for this purpose.

The crystalline silicon semiconductor layer 4 is a semiconductor thin film formed on the gate insulating layer 3, and is a channel layer having a predetermined channel region in which movement of carriers is controlled by the voltage applied to the gate electrode 2. The channel region refers to a region above the gate electrode 2. The length of the channel region in the charge movement direction corresponds to the gate length. The crystalline silicon semiconductor layer 4 may be formed by crystallizing amorphous silicon, for example.

The grain size of the crystalline silicon in the crystalline silicon semiconductor layer 4 is, for example, approximately 5 nm to 1000 nm. In this case, the crystalline silicon semiconductor layer 4 may comprise only polycrystalline silicon having an average grain size of 100 nm or more. Other than this, the crystalline silicon semiconductor layer 4 may have a mixed crystal structure of the polycrystalline silicon and microcrystalline silicon referred to as microcrystal having an average grain size of at least 20 nm and less than 40 nm, or a mixed crystal structure of amorphous silicon and crystalline silicon. In order to achieve excellent turn-on characteristics, at least the channel region of the crystalline silicon semiconductor layer 4 is formed of a film having a high ratio of crystalline silicon, for example. Note that, the thickness of the crystalline silicon semiconductor layer 4 is, for example, approximately 10 nm to 90 nm.

The amorphous silicon semiconductor layer 5 is a semiconductor thin film formed on the crystalline silicon semiconductor layer 4, and is, for example, an intrinsic amorphous silicon film. Note that, the thickness of the amorphous silicon semiconductor layer 5 is, for example, approximately 10 nm to 60 nm.

The semiconductor layer 40 according to this embodiment has a stacked structure of the crystalline silicon semiconductor layer 4 and the amorphous silicon semiconductor layer 5, but the present invention is not limited to the example. The semiconductor layer 40 may include only a silicon semiconductor layer made of the crystalline silicon semiconductor layer or the amorphous silicon semiconductor layer. Further-more, examples of the semiconductor layer 40 include a metal oxide semiconductor layer and an organic semiconductor layer, other than the silicon semiconductor layer.

The protective layer 6 is an etch-stopper layer formed on the semiconductor layer 40, and is a channel protective film for protecting the semiconductor layer 40 that is to be a channel layer. More specifically, the protective layer 6 functions as a channel etch-stopper (CES) layer for preventing the channel region of the semiconductor layer 40 from being etched during the etching process for patterning the pair of contact layers 7 and the semiconductor layer 40. The protective layer 6 according to this embodiment is formed on the amorphous silicon semiconductor layer 5. In this embodiment, the thickness of the protective layer 6 in the region overlapping with the source electrode 8S or the drain electrode 8D is, for example, 300 nm to 1 µm. Furthermore, the thickness of the protective layer 6 is at least 500 nm and at most 1 µm, for example.

The lower limit of the thickness of the protective layer 6 is determined in consideration for margin due to etching and reduction in effect of fixed charges in the protective layer 6. The upper limit of the thickness of the protective layer 6 is determined in consideration for suppressing a decrease in process reliability due to discontinuity of the contact layer 7 or the like caused by an increase in the level difference between the protective layer 6 and the amorphous silicon semiconductor layer 5.

The protective layer 6 comprises silicon (Si) and oxygen (O) as major components. The protective layer 6 according to this embodiment is an organic material film mainly comprising organic materials including silicon, oxygen, and carbon (C). In this case, the protective layer 6 may comprise, for example, polysiloxane. Polysiloxane has silica bonding as a main chain to which organic components having carbon such as methyl are combined. The protective layer 6 may be formed by applying an organic application material by the spin coating or others. Other than the application method such as the spin coating, the protective layer 6 may be formed by a droplet discharging method or a printing method, such as the screen printing or the offset printing, which allows formation of a predetermined pattern.

The protective layer 6 having such a configuration includes a non-altered layer 61 and an altered layer 62. The non-altered layer 61 is a portion of the protective layer 6 not altered by dry etching performed to pattern the semiconductor layer 40. The non-altered layer 61 is the protective layer 6 excluding the altered layer 62. On the other hand, the altered layer 62 is a layer generated by the surface layer of the protective layer 6 being altered by dry etching performed to pattern the semiconductor layer 40. The altered layer 62 is a surface region of the protective layer 6 exposed from the source electrode 8S and the drain electrode 8D. The altered layer is generated in a region having at least a portion contacting the surface of the semiconductor layer 40. In (b) in FIG. 1, the non-altered layer 61 is visible, but normally, the non-altered layer 61 is covered with the modified layer 62, which makes the non-altered layer 61 invisible. In (b) in FIG. 1, the non-altered layer 61 is shown for convenience. The same also applies below.

As shown in (c) in FIG. 1, the edge portion of the region of the protective layer 6 exposed from the source electrode 8S and the drain electrode 8D is tapered by dry etching performed to pattern the semiconductor layer 40. As a result, the lateral side of the edge portion of the exposed region is sloped. More specifically, the protective layer 6 is etched so that the exposed region has an edge portion (the altered layer 62) with a predetermined taper angle (8).

The protective layer 6 has insulation properties. The pair of contact layers 7 is not electrically connected to each other.

The pair of contact layers 7 is formed of amorphous semiconductor layers having a high concentration of impurities or polycrystalline semiconductor layers having a high concentration of impurities. The pair of contact layers 7 may be, for example, n-type semiconductor layers formed by doping phosphorous (P) in the amorphous silicon as n-type impurity, and n⁺ layers including a high concentration of impurities of at least $1 \times 10^{19}$ [atm/cm³].

The pair of contact layers 7 is opposed to each other at a predetermined distance on the protective layer 6. Each of the contact layers 7 is formed from the upper surface of the protective layer 6 covering the amorphous silicon semiconductor layer 5. The thickness of each of the contact layers 7 may be 5 nm to 100 nm, for example.

The pair of contact layers 7 according to this embodiment is formed between (i) the amorphous silicon semiconductor layer 5 and (ii) the source electrode 8S and the drain electrode 8D, but is not formed on the lateral side of the semiconductor layer 40 (the lateral side of the amorphous silicon semiconductor layer 5 and the lateral side of the crystalline silicon semiconductor layer 4). More specifically, the pair of contact layers 7 is flush with the semiconductor layer 40 (the amorphous silicon semiconductor layer 5 and the crystalline silicon semiconductor layer 4).

The pair of contact layers 7 has a single layer structure, but may include two layers of a low-concentration field relief layer (n⁻ layer) serving as the lower layer and a high-concentration contact layer (n⁺ layer) serving as the upper layer. In this case, for example, the low-concentration field relief layer is formed by doping phosphorous (P) of approximately $1 \times 10^{17}$ [atm/cm³].

A pair of the source electrode 8S and the drain electrode 8D are opposed to each other at a predetermined distance, and is formed on the pair of contact layers 7, flush with the contact layers 7.

The source electrode 8S covers one of the end portions of the protective layer 6 and the semiconductor layer 40 (the amorphous silicon semiconductor layer 5) via one of the contact layers 7. On the other hand, the drain electrode 8D covers the other end portion of the protective layer 6 and the semiconductor layer 40 (the amorphous silicon semiconductor layer 5) via the other contact layer 7.

In this embodiment, each of the source electrode 8S and the drain electrode 8D may has a single-layer structure or multilayer structure comprising a conductive material, an alloy including the materials, or the like. Example of the materials of the source electrode 8S and the drain electrode 8D include aluminum (Al), molybdenum (Mo), tungsten (W), copper (Cu), titanium (Ti), and chromium (Cr). In this embodiment, the source electrode 8S and the drain electrode 8D may have a try-layer structure of MoW/Al/MoW. The thickness of the source electrode 8S and the drain electrode 8D may be, for example, approximately 100 nm to 500 nm.

The passivation layer 9 is formed to cover the source electrode 8S, the drain electrode 8D, and the protective layer 6 exposed between the source electrode 8S and the drain electrode 8D. The thickness of the passivation layer 9 may be, for example, at least 20 nm and at most 1000 nm.

The passivation layer 9 comprises major components identical to those of the protective layer 6. In this embodiment, since the protective layer 6 comprises silicon and oxygen as major components, the passivation layer 9 also comprises silicon and oxygen as major components. While the protective layer 6 comprises organic materials, the passivation layer 9 comprises inorganic materials. For example, the passivation layer 9 may comprise silicon oxide. Instead, the passivation layer 9 may comprise silicon nitride. The passivation layer 9 is used, for example, in order to prevent impurities such as oxygen and water outside from entering the semiconductor layer materials composing the thin-film transistor 10.

Figure 2:
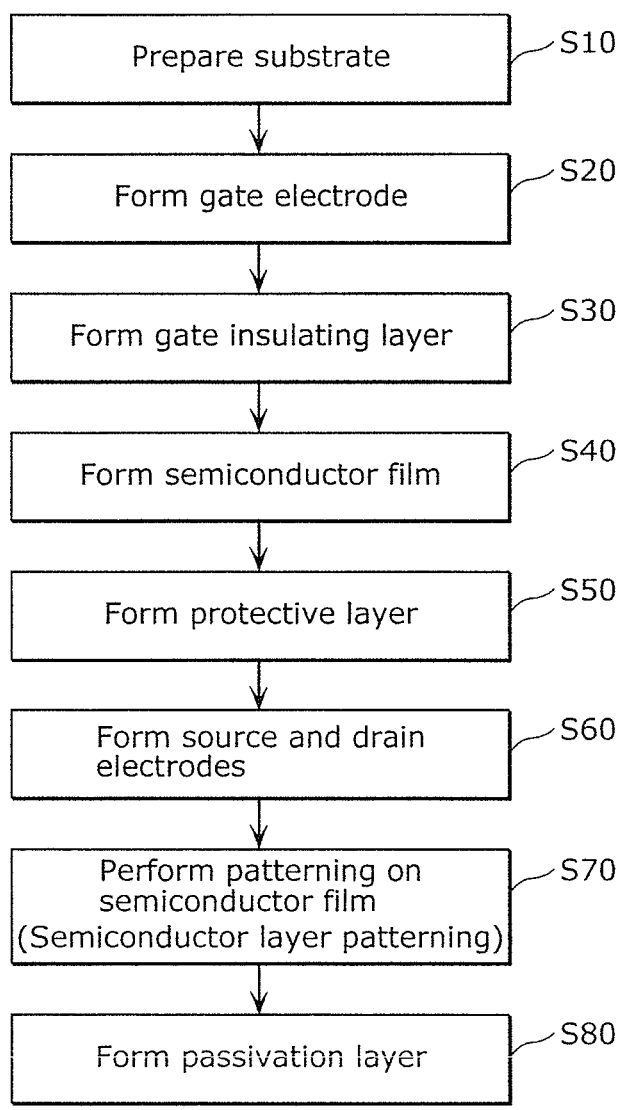
FIG. 2 is a flowchart of a method for manufacturing the thin-film transistor according to the embodiment of the present invention.

Next, the following shall describe a method for manufacturing the thin-film transistor 10 according to the embodiment of the present invention, with reference to FIG. 2 and FIGS. 3A to 3J. FIG. 2 is a flowchart of a method for manufacturing the thin-film transistor according to the embodiment of the present invention. FIG. 3A to FIG. 3J are cross-sectional views schematically illustrating each process in the method for manufacturing the thin-film transistor according to the embodiment of the present invention. In each of FIGS. 3A to 3J, (a) shows a cross sectional view of the thin-film transistor taken along line A-A' in (b), and (b) shows a plan view of the thin-film transistor. To facilitate understanding, the same hatching is used for the same constituent element in each of the plan views and cross-sectional views.

As shown in FIG. 2, the method for manufacturing the thin-film transistor 10 according to this embodiment includes: preparing the substrate 1 (S10); forming the gate electrode 2 (S20); forming the gate insulating layer 3 (S30); forming the semiconductor film 40F (S40); forming the protective layer 6 (etch-stopper layer) (S50); forming the source electrode 8S and the drain electrode 8D (S60); patterning the semiconductor film 40F into a predetermined shape by dry etching (S70); and forming the passivation layer 9 (S80). The semiconductor formation (S40) according to this embodiment includes: forming a first semiconductor film; and forming a second semiconductor film. Hereinafter, detailed descriptions are given of each process in the manufacturing method according to this embodiment.

Figure 3A:
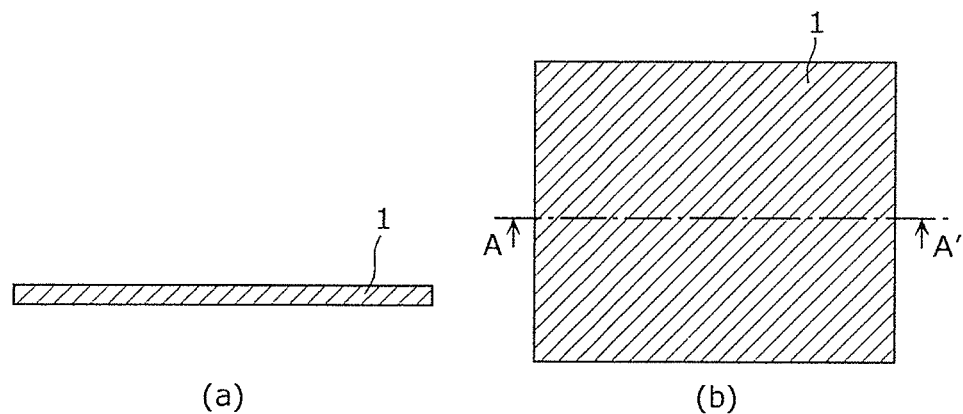
FIG. 3A shows a cross-sectional view and a plan view schematically illustrating a substrate preparation in the method for manufacturing the thin-film transistor according to the embodiment of the present invention.

First, as shown in FIG. 3A, the substrate 1 is prepared (substrate preparation). As the substrate 1, a glass substrate is prepared, for example. Before forming the gate electrode 2, an undercoat layer may be formed on the substrate 1 by the plasma chemical vapor deposition (CVD) or others. Furthermore, the process of preparing the substrate 1 also includes cleaning the substrate 1, for example, other than forming the undercoat layer.

Figure 3B:
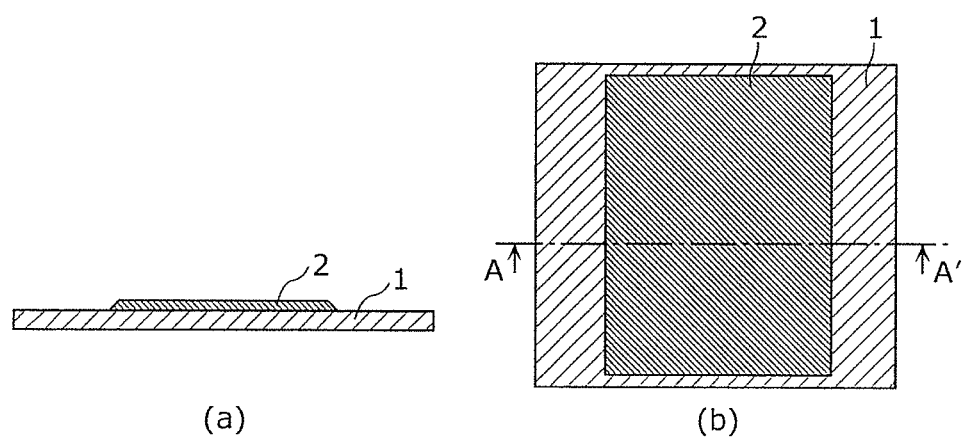
FIG. 3B shows a cross-sectional view and a plan view schematically illustrating a gate electrode formation in the method for manufacturing the thin-film transistor according to the embodiment of the present invention.

Next, as shown in FIG. 3B, the gate electrode 2 in a predetermined shape is formed above the substrate 1 by patterning (gate electrode formation). For example, the gate electrodes 2 in a rectangular shape is formed by forming a gate metal film comprising molybdenum-tungsten (MoW) or the like on the entire surface of the substrate 1 through sputtering, and by patterning the gate metal film using the photolithography and the wet etching.

Figure 3C:
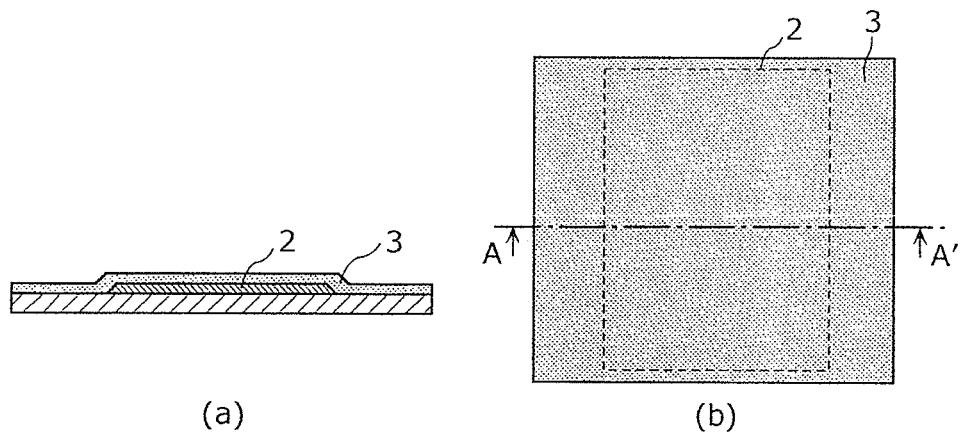
FIG. 3C shows a cross-sectional view and a plan view schematically illustrating a gate insulating layer formation in the method for manufacturing the thin-film transistor according to the embodiment of the present invention.

Next, as shown in FIG. 3C, the gate insulating layer 3 is formed above the substrate 1 (gate insulating layer formation). For example, the gate insulating layer 3 is formed, by the plasma CVD or others, over the entire upper surface of the substrate 1 covering the gate electrode 2. In this embodiment, the gate insulating layer 3 is formed which has a two-layer structure of a silicon oxide film and a silicon nitride film.

Figure 3D:
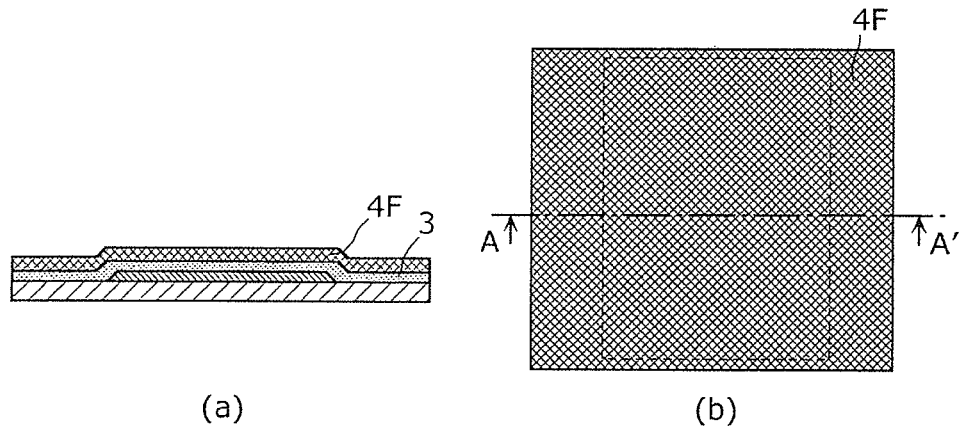
FIG. 3D shows a cross-sectional view and a plan view schematically illustrating a crystalline silicon semiconductor layer formation in the method for manufacturing the thin-film transistor according to the embodiment of the present invention.

Next, as shown in FIG. 3D, the crystalline silicon semiconductor film 4F is formed on the gate insulating layer 3, as the first semiconductor film (first semiconductor film formation). In this case, first, an amorphous silicon thin film made of an amorphous silicon film, for example, is formed on the gate insulating layer 3 by the plasma CVD or others. The amorphous silicon film can be formed under a predetermined film-forming condition, by introducing silane gas ($SiH_4$) and hydrogen gas ($H_2$) in a predetermined ratio of concentration, for example. Subsequently, a dehydrogenation annealing is performed, and the amorphous silicon thin film is annealed in the predetermined temperature so as to crystallize the amorphous silicon thin film. With this, the crystalline silicon semiconductor film 4F is formed on the gate insulating layer 3.

Note that, in this embodiment, the amorphous silicon thin film is crystallized by the laser annealing, which involves irradiating the amorphous silicon thin-film with a laser beam. Examples of the laser annealing include laser annealing using an excimer laser (ELA) with wavelength of 190 nm to 350 nm approximately, laser annealing using a pulse laser with wavelength of 370 nm to 900 nm approximately, and laser annealing using a continuous wave laser (CW laser) with wavelength of 370 nm to 900 nm approximately. Other than the laser annealing, the amorphous silicon thin film may be crystallized using the rapid thermal processing (RTP) or rapid thermal annealing (RTA). Instead of forming the crystalline silicon semiconductor film by crystallizing the amorphous silicon thin film, the crystalline silicon semiconductor film 4F may be formed by directly growing crystals by the CVD.

Figure 3E:
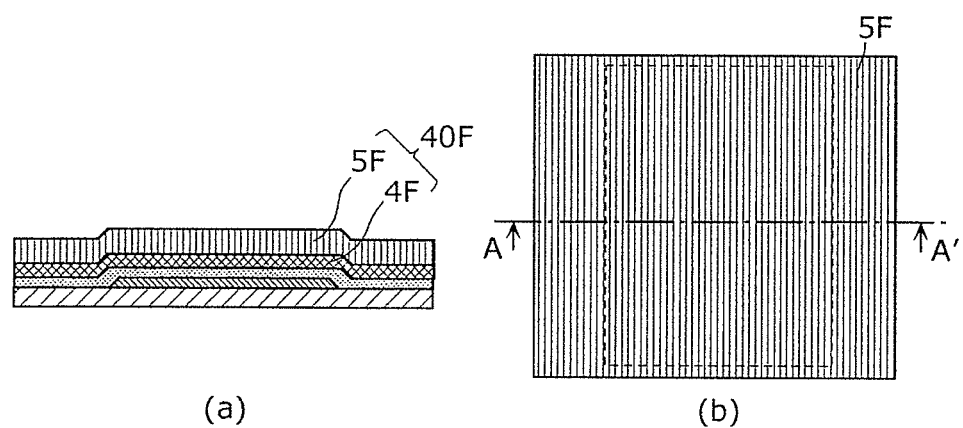
FIG. 3E shows a cross-sectional view and a plan view schematically illustrating an amorphous silicon semiconductor layer formation in the method for manufacturing the thin-film transistor according to the embodiment of the present invention.

Next, as shown in FIG. 3E, an amorphous silicon semiconductor film 5F is formed on the crystalline silicon semiconductor layer 4F, as a second semiconductor film (second semiconductor film formation). For example, an amorphous silicon film may be formed as the amorphous silicon semiconductor film 5F. The amorphous silicon film can be formed in a predetermined film-forming condition by the plasma CVD or others, using source gas including silane gas ($SiH_4$), disilane gas ($Si_2H_6$), or trisilane gas ($Si_3H_8$). As an inert gas introduced with the source gas, other than the hydrogen gas ($H_2$), argon gas (Ar) or helium gas (He) may be introduced in a predetermined ratio of concentration to form the amorphous silicon film.

With this, the semiconductor film 40F, which is stacked films of the crystalline silicon semiconductor layer 4F and the amorphous silicon semiconductor film 5F, is formed on the gate insulating layer 3.

After forming the semiconductor film 40F, hydrotreatment process may be performed on silicon atoms in the crystalline silicon semiconductor film 4F by performing hydrogen plasma treatment on the semiconductor film 40F. The hydrogen plasma treatment is performed, for example, by generating hydrogen plasma by radio-frequency (RF) power from gas including hydrogen gas such as $H_2$ or $H_2$/Argon (Ar), and irradiating the semiconductor film 40F with the hydrogen plasma. The hydrogen plasma treatment generates, in the plasma atmosphere, hydrogen plasma including hydrogen ion ($H^+$) and hydrogen radical ($H^*$). Entry of the generated hydrogen ion and hydrogen radical into the crystalline silicon semiconductor film 4F causes hydrogen termination of dangling-bond of silicon atoms included in the crystalline silicon semiconductor film 4F. More specifically, dangling-bond of silicon atoms is combined with hydrogen. This reduces crystallinity defect density of the crystalline silicon semiconductor film 4F, thereby improving crystallinity of the crystalline silicon semiconductor film 4F. The defect density of the semiconductor film 40F can be adjusted by adjusting the conditions of the hydrogen plasma treatment. The hydrogen plasma treatment need not be necessarily performed when the semiconductor film 40F is formed of a material other than silicon semiconductor, such as oxide semiconductor, or organic semiconductor.

Figure 3F:
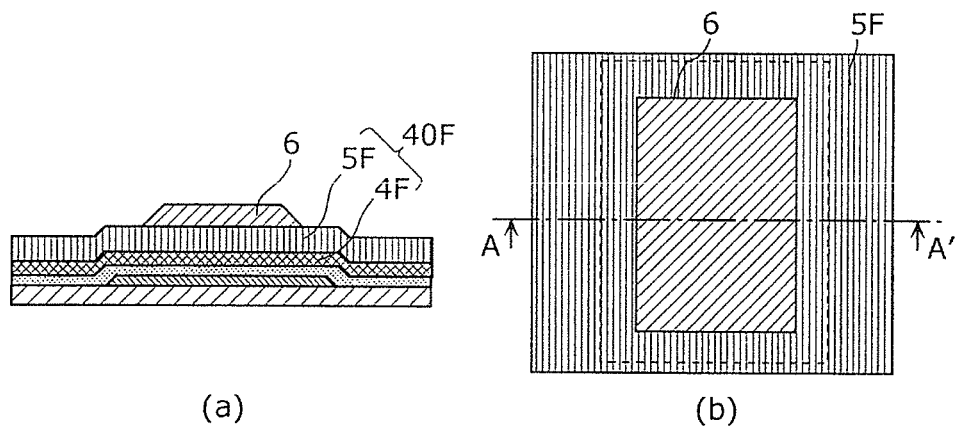
FIG. 3F is a cross-sectional view and a plan view schematically illustrating a protective layer formation in the method for manufacturing the thin-film transistor according to the embodiment of the present invention.

Next, as shown in FIG. 3F, the protective layer 6 to be an etch-stopper layer is formed on the semiconductor film 40F (protective layer formation). For example, the protective layer 6 made of an organic protective film is formed by applying a predetermined organic material on the semiconductor film 40F by a predetermined application method and baking the organic material.

In this embodiment, an organic material comprising polysiloxane is applied to the amorphous silicon semiconductor film 5F first, and the spin coating is applied. With this, the protective layer 6 is formed on the entire surface of the amorphous silicon semiconductor film 5F. Subsequently, the protective layer 6 is pre-baked. After that, the protective layer 6 in the predetermined shape is formed by exposure and development using a photo mask. After that, post-baking on the protective layer 6 is performed. With this, the protective layer 6 in the predetermined shape is formed.

Figure 3G:
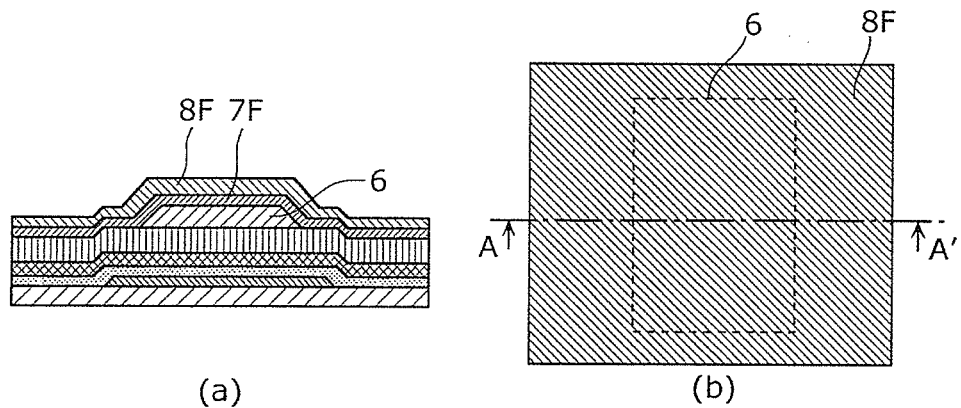
FIG. 3G shows a cross-sectional view and a plan view schematically illustrating a contact layer film formation and a source/drain metal film formation in the method for manufacturing the thin-film transistor according to the embodiment of the present invention.

Next, as shown in FIG. 3G, a contact layer film 7F is formed on the semiconductor film 40F (the amorphous silicon semiconductor film 5F) so as to cover the protective layer 6 (contact layer film formation). For example, the contact layer film 7F comprising amorphous silicon doped with an impurity of pentavalent element such as phosphorous is formed by the plasma CVD.

Next, as shown in FIG. 3G, a source-drain metal film 8F for forming the source electrode 8S and the drain electrode 8D is formed on the contract layer film 7F. For example, the source-drain metal film 8F with a try-layer structure of MoW/Al/MoW is formed by sputtering (source-drain metal film formation).

Figure 3H:
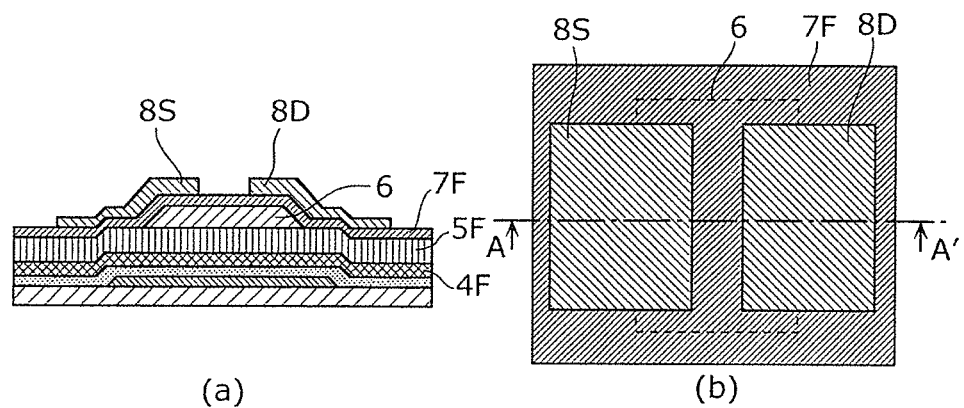
FIG. 3H shows a cross-sectional view and a plan view schematically illustrating a source/drain metal film patterning in the method for manufacturing the thin-film transistor according to the embodiment of the present invention.

Next, as shown in FIG. 3H, a pair of the source electrode 8S and the drain electrode 8D is formed on the amorphous silicon semiconductor film 5F, interposing the protective layer 6, by pattering the source drain metal film 8F. More specifically, a resist is applied on the source-drain metal film 8F for patterning the source-drain metal film 8F in the predetermined shape, and exposure and development is performed to pattern the resist into a shape corresponding to the shape of the source electrode 8S and the drain electrode 8D. Next, the source-drain metal film 8F is pattern by performing etching such as wet etching using the resist as a mask. With this, as shown in FIG. 3H, the pair of the source electrode 8S and the drain electrode 8D which are separated and in the predetermined shape are formed. Here, note that the contact layer film 7F functions as an etch-stopper.

Figure 3I:
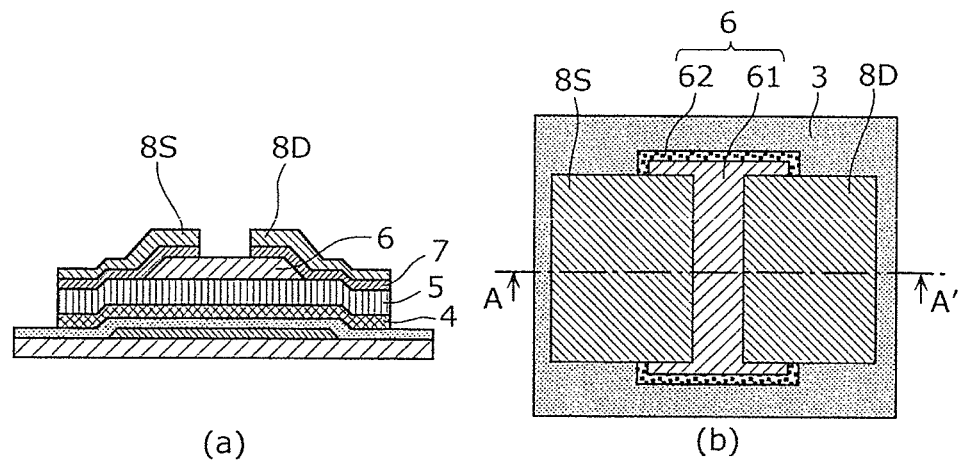
FIG. 3I shows a cross-sectional view and a plan view schematically illustrating a contact layer film patterning and a semiconductor layer patterning in the method for manufacturing the thin-film transistor according to the embodiment of the present invention.

Subsequently, the resist on the source electrode 8S and the drain electrode 8D is removed, and etching, such as dry etching, is performed using the source electrode 8S and the drain electrode 8D as masks so as to pattern the contract layer film 7F. At the same time, the semiconductor film 40F (the amorphous silicon semiconductor film 5F and the crystalline silicon semiconductor film 4F) is patterned into an island shape (semiconductor film patterning). Accordingly, as shown in FIG. 3I, the pair of contact layers 7 in the predetermined shape is formed, and the amorphous silicon semiconductor layer 5 and the crystalline silicon semiconductor layer 4 patterned into the island shape are formed. Here, note that the protective layer 6 functions as an etch-stopper layer.

In this embodiment, the semiconductor film 40F is patterned by a dry etching apparatus in the etching conditions that the etching gas is $Cl_2$ gas, the pressure is 2 Pa, and inductive coupled plasma (ICP) power is 300 W. In this embodiment, dry etching is performed on the semiconductor film 40F after removing the resist on the source electrode 8S and the drain electrode 8D; however, dry etching may be performed without removing the resist.

In such a case, as shown in (b) in FIG. 3I, dry etching performed to pattern the semiconductor film 40F generates the altered layer 62 near the surface of the protective layer 6 in the region of the protective layer 6 exposed from the source electrode 8S and the drain electrode 8D. More specifically, the altered layer 62 is generated by the surface layer of the protective layer 6 exposed from the source electrode 8S and the drain electrode 8D being altered by the etching gas used in the dry etching. Furthermore, as shown in FIG. 3I, the altered layer 62 appears particularly at the lateral portion of the exposed protective layer 6. As described above, the protective layer 6 obtained after performing dry etching on the semiconductor film 40F includes the non-altered layer 61 which is a portion of the protective layer 6 (bulk layer) not altered by the dry etching and the altered layer 62 which is a portion of the protective layer 6 altered by the dry etching and which has at least a portion contacting the surface of the semiconductor layer 40.

Furthermore, the dry etching performed to pattern the semiconductor film 40F etches the edge portion of the region of the protective layer 6 exposed from the source electrode 8S and the drain electrode 8D to have a taper angle.

As described above, dry etching performed to pattern the semiconductor film 40F alters the surface layer of the protective layer 6 in the region exposed form the source electrode 8S and the drain electrode 8D, into an altered layer, and also etches the edge portion of the exposed region into a tapered shape having a taper angle, making the lateral side of the edge portion sloped.

Figure 3J:
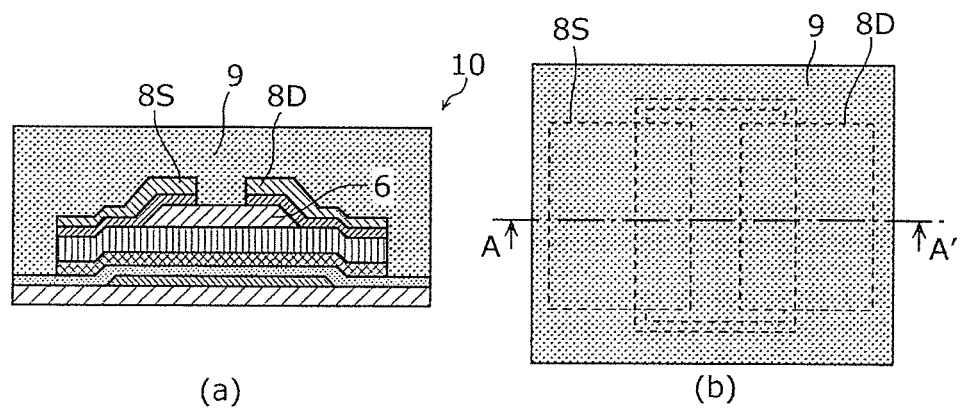
FIG. 3J shows a cross-sectional view and a plan view schematically illustrating a passivation layer formation in the method for manufacturing the thin-film transistor according to the embodiment of the present invention.

Lastly, as shown in FIG. 3J, the passivation layer 9 is formed (passivation layer formation). In this embodiment, the passivation layer 9 is formed so as to cover all of the exposed components (the source electrode 8S, the drain electrode 8D, the protective layer 6, and the amorphous silicon semiconductor layer 5).

For example, the passivation layer 9 comprises a material including the major component identical to that of the protective layer 6. In this embodiment, the passivation layer 9 comprising silicon oxide ($SiO_x$) is formed by the plasma CVD.

The thin-film transistor 10 according to this embodiment is manufactured as described above.

Next, detailed descriptions are given of the functions and effects of the thin-film transistor 10 according to this embodiment, including how the present invention was achieved.

Figure 4A:
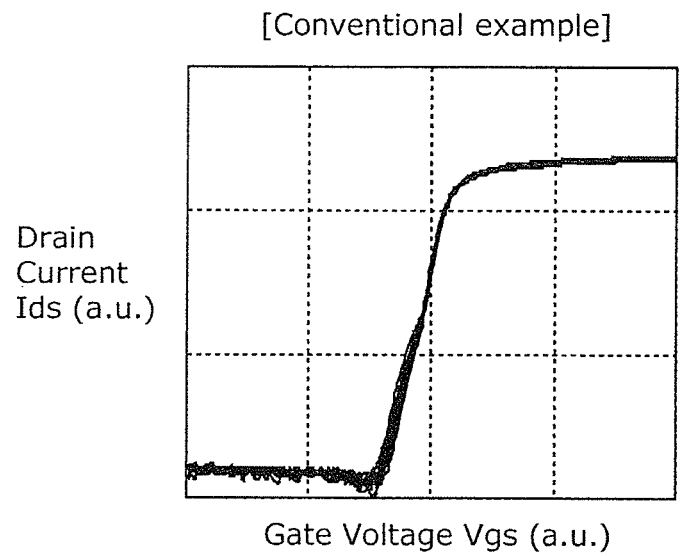
FIG. 4A shows current-voltage characteristics of the conventional thin-film transistor.

The thin-film transistor including an etch-stopper layer (protective layer) comprising organic application materials has a problem in that it is difficult to obtain desired transistor characteristics (current-voltage characteristics). The current-voltage characteristics of the thin-film transistor were measured. The results are, as shown in FIG. 4A, that a hump, referred to as hump phenomenon, is included in the range where current rapidly increases.

Figure 4B:
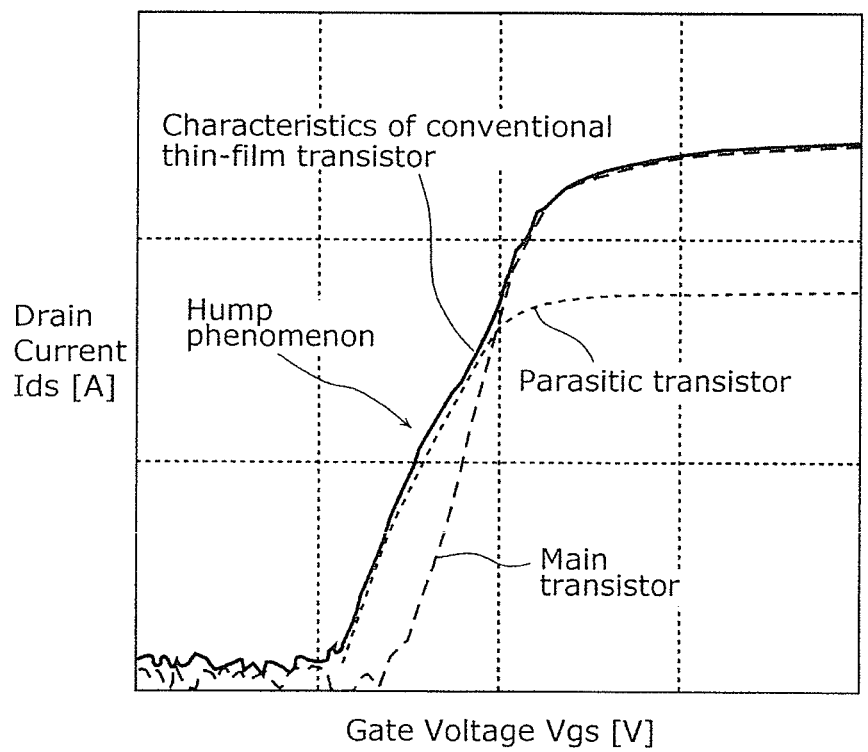
FIG. 4B illustrates hump phenomenon in the current-voltage characteristics of a conventional thin-film transistor.

Here, referring to FIG. 4B, a description is given of the hump phenomenon. The hump phenomenon is considered to be caused due to presence of a parasitic transistor other than the main transistor in a single thin-film transistor, as shown in FIG. 4B. The hump phenomenon refers to a phenomenon in which an unnatural hump is included in the current-voltage characteristics of the single thin-film transistor by the current-voltage characteristics of the main transistor being combined with the current-voltage characteristics of the parasitic transistor. Note that in this Description, the organic application materials refer to materials comprising organic materials including carbon, and refer to materials that can be formed by printing process, such as inkjet printing, or application process, such as spin coating.

After diligent analysis and consideration on the cause of the hump phenomenon, the inventors found out the following cause. In the case where an organic application material is used for the etch-stopper layer (protective layer), the exposed etch-stopper layer is damaged when patterning the semiconductor film into a predetermined shape (an island shape). This generates, near the surface of the etch-stopper layer, an altered layer which is generated by alteration of the organic application material that is a base material of the etch-stopper layer. The inventors also found out that the thickness of the etch-stopper layer decreases at the exposed outer peripheral edge portion of the etch-stopper layer due to etching. The above finding shows that the parasitic transistor is formed by the newly generated altered layer contacting the semiconductor layer, which causes the hump phenomenon.

Figure 5:
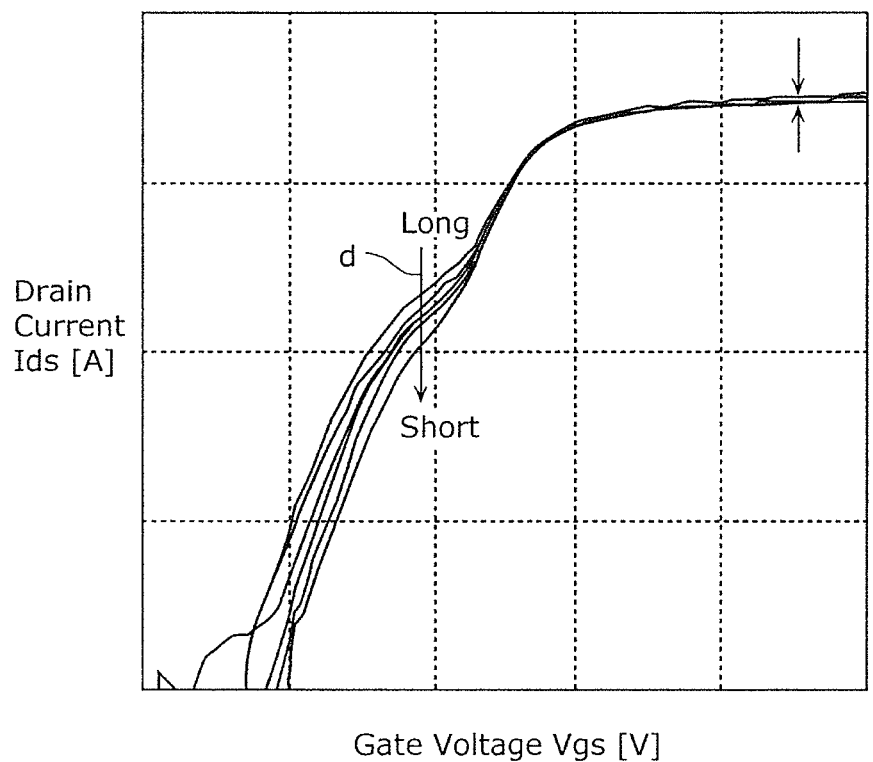
FIG. 5 is a diagram showing respective current-voltage characteristics of the thin-film transistor shown in FIG. 1 obtained when the protective layer and the altered layer protrude, by different length, from the source electrode (drain electrode) in the gate width direction.

Referring to FIG. 5, more detailed descriptions will be given of occurrence of the parasitic transistor. FIG. 5 is a diagram showing respective current-voltage characteristics of the thin-film transistor shown in FIG. 1 obtained when the protective layer 6 protrude, by different length (d), from the source electrode (drain electrode) in the gate width direction.

As shown in FIG. 5, in the current-voltage characteristics of respective thin-film transistors having different protruding length d, saturated current values of the main transistor do not vary, but the saturated current values of the parasitic transistor vary depending on the protruding length d. More specifically, as the protruding length d increases, the saturated current value of the parasitic transistor decreases. This shows that the portion which causes the parasitic transistor, that is, the altered layer 62 is present at the outer peripheral edge portion of the protective layer 6.

Now, referring back to (c) in FIG. 1, detailed descriptions are given of occurrence of the hump phenomenon due to the altered layer 62.

Normally, the entire surface of the semiconductor layer 40 at the back channel side is covered with the protective layer 6 which has uniform composition of elements and a uniform concentration of the composition of the elements, and the amount of fixed charges at the back channel side is uniform within a surface of the substrate. More specifically, in such a case, hump phenomenon does not occur in the current-voltage characteristics of the thin-film transistor.

However, as described above, in the case where the organic application material is used as the material for the protective layer 6, dry etching performed to pattern the semiconductor layer 40 alters the organic application material in the protective layer 6, thereby forming the altered layer 62. In addition, since etching is performed while the lateral side of the semiconductor layer 40 recedes, the semiconductor 40 contacts the altered layer 62 at the outer peripheral edge portion of the protective layer 6. Hence, the back channel side of the semiconductor layer 40 contacts the altered layer 62 that is a layer generated by the protective layer 6 being altered by dry etching, and also contacts the non-altered layer (bulk layer) 61 that is the protective layer 6 not altered by the dry etching. In this case, the altered layer 62 and the non-altered layer 61 have different amount of fixed charges. A larger amount of fixed charges is generated in the altered layer 62 which has been damaged. In such a manner, the parasitic transistor is caused because the semiconductor layer 40 contacts the altered layer 62 which includes a larger amount of fixed charges. It is considered that such a parasitic transistor causes the hump phenomenon in the current-voltage characteristics.

Figure 6:
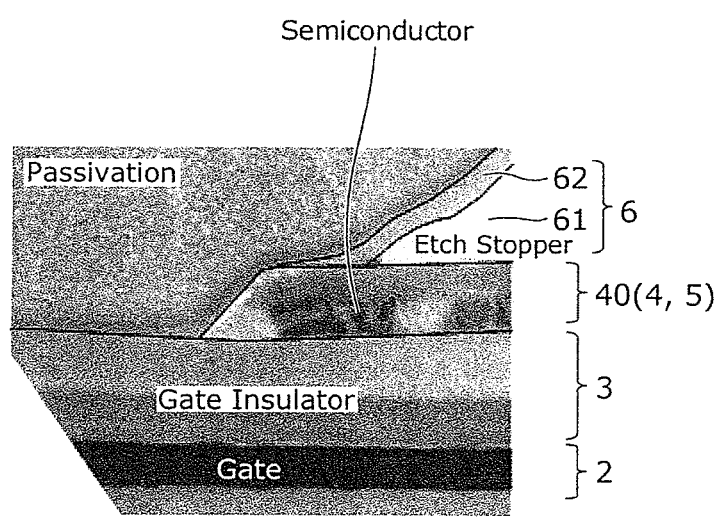
FIG. 6 is a cross-sectional TEM image of an outer peripheral edge portion of the protective layer of the thin-film transistor shown in FIG. 1.

The thin-film transistor 10 was actually manufactured, and cross-section observation was performed on the portion corresponding to (c) in FIG. 1 using a transmission electron microscope (TEM). FIG. 6 is a cross-sectional TEM image of the neighboring portions of the outer peripheral edge of the protective layer of the thin-film transistor shown in FIG. 1. In FIG. 6, the passivation layer is also formed.

The cross-sectional TEM image shown in FIG. 6 shows that the altered layer 62 having a thickness of approximately 30 nm is present on the surface (sloped side) of the protective layer 6 (non-altered layer 61) and contacts the semiconductor layer 40 at the outer peripheral edge portion of the protective layer 6. Furthermore, since the color strength in the TEM image represents difference in density (volume density), the TEM image shows that a layer (the altered layer 62) which is clearly different from the non-altered layer 61 is present near the surface of the protective layer 6. Furthermore, since the altered layer 62 is darker than the protective layer 6 (non-altered layer 61) serving as a base, the TEM image shows that the density of the altered layer 62 (volume density) is higher than the density (volume density) of the non-altered layer 61.

Figure 7A:
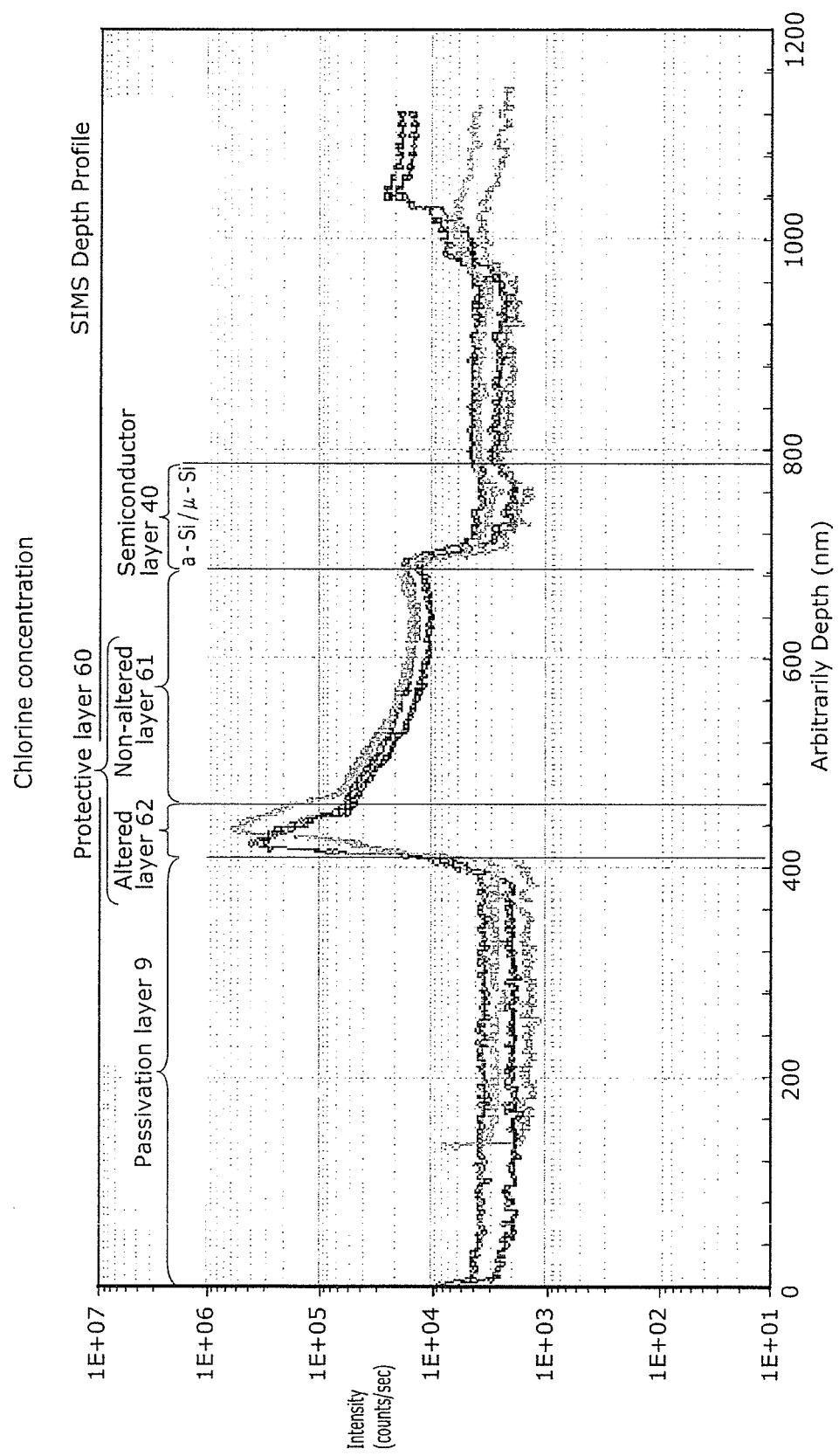
FIG. 7A shows concentration distribution of chlorine in films of the thin-film transistor shown in FIG. 1.

Here, referring to FIG. 7A and FIG. 7B, a description is given of concentration distribution of chlorine (Cl) and carbon (C) in the thin-film transistor 10. FIG. 7A shows concentration distribution of chlorine in films of the thin-film transistor shown in FIG. 1. FIG. 7B shows concentration distribution of carbon in the films of the thin-film transistor shown in FIG. 1. Note that FIG. 7A and FIG. 7B show results of analysis performed on a single film with use of a secondary ion-microprobe mass spectrometer (SIMS). Furthermore, FIG. 7A and FIG. 7B each shows analysis results of multiple samples. FIG. 7A shows that a layer, in which a larger amount of chlorine is detected than the other layers, is present between the passivation layer 9 and the non-altered layer 61. Furthermore, FIG. 7B shows that a layer, which has a higher carbon concentration than that of the passivation layer 9 and a lower carbon concentration than that of the non-altered layer 61, is present between the passivation layer 9 and the non-altered layer 61. The layer which appears between the passivation layer 9 and the non-altered layer 61 is the altered layer 62 which includes a large amount of chlorine elements that is a source gas used in dry etching, other than the composition of the organic application material of the protective layer 6. More specifically, the altered layer 62 is a layer generated by the protective layer 6 being altered by the source gas of the dry etching.

Furthermore, since the altered layer 62 has a lower carbon concentration than that of the non-altered layer 61, it is considered that the altered layer 62 is generated by alteration of carbon in the protective layer 6. As described above, based on the results shown in FIG. 7A and FIG. 7B, it is understood that the altered layer 62 is a layer generated by the organic application material serving as a base for the protective layer 6 being combined with the source gas of dry etching.

FIG. 7A also shows that the altered layer 62 has a chlorine concentration at least ten times higher than the chlorine concentration of the protective layer 6 (non-altered layer 61). Furthermore, FIG. 7B also shows that the altered layer 62 has a carbon concentration which is at most one hundredth of the carbon concentration of the protective layer 6 (non-altered layer 61).

After further diligent analysis and consideration, the inventors further found out that the hump phenomenon is related with the taper angle θ of the protective layer 6 and the defect density of the semiconductor layer 40.

Figure 8:
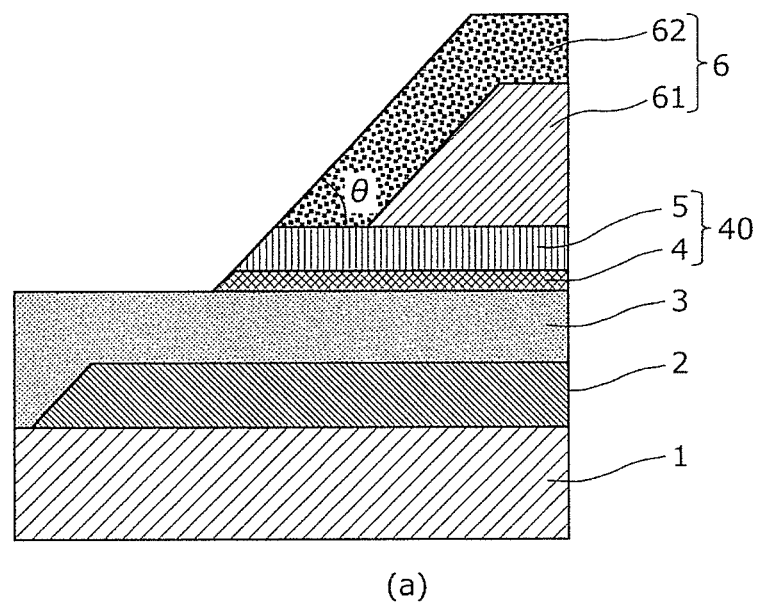
FIG. 8 illustrates a relationship between the taper angle of the protective layer and hump phenomenon in the thin-film transistor.
Figure 8:
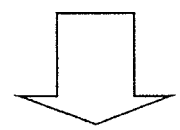
Figure 8:
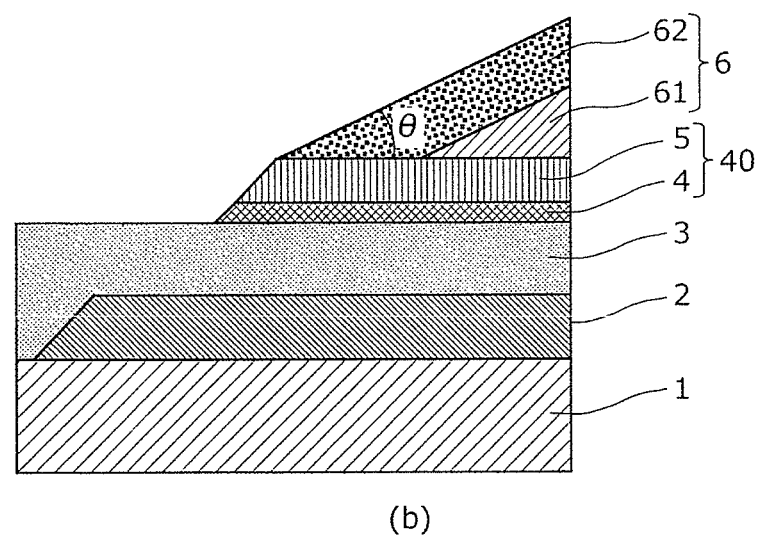

First, referring to FIG. 8, a description is given of relationship between the taper angle θ of the protective layer 6 and the hump phenomenon. FIG. 8 illustrates the relationship between the taper angle of the protective layer and hump phenomenon in the thin-film transistor, and corresponds to (c) in FIG. 1. In FIG. 8, (a) shows a case of a larger taper angle θ, and (b) shows a case of a smaller taper angle θ.

As described above, dry etching performed to pattern the semiconductor film 40F into an island shape alters the region of the protective layer 6 exposed from the source electrode 8S and the drain electrode 8D, and also tapers the edge portion of the exposed region, making the edge portion recede. Here, as shown in FIG. 8, part of the protective layer 6 is removed such that the lateral side of the edge portion of the exposed region is sloped and a predetermined taper angle θ is formed. The taper angle θ of the protective layer 6 is an angle formed by the surface of the semiconductor layer 40 (amorphous silicon semiconductor layer 5) and the lateral side of the protective layer 6 (altered layer 62). The taper angle θ of the protective layer 6 can be adjusted by adjusting the temperature of pre-bake at the time of forming the protective layer 6.

As shown in (a) and (b) in FIG. 8, as the sloped surface of the edge portion of the protective layer 6 (altered layer 62) becomes closer to being horizontal, that is, as the taper angle θ of the protective layer 6 decreases, the protective layer 6 recedes further inward at the dry etching, and the contact area between the altered layer 62 and the semiconductor layer 40 increases.

In this case, as described above, the altered layer 62 is considered to include a larger amount of fixed charges than the non-altered layer 61. Hence, as the contact area between the altered layer 62 and the semiconductor layer 40 increases, the threshold value (threshold voltage) of the parasitic transistor caused due to the altered layer 62 further departs from the threshold value (threshold voltage) of the main transistor. This increases the hump phenomenon. More specifically, the protective layer 6 having a smaller taper angle θ as shown in (b) in FIG. 8 includes more marked hump phenomenon than the protective layer 6 having a larger taper angle as shown in (a) in FIG. 8. In this way, the degree of the hump phenomenon varies depending on the taper angle θ of the protective layer 6. Hence, occurrence of the hump phenomenon can be reduced by adjusting the taper angle θ of the protective layer 6 as desired.

Next, a description is given of the relationship between the defect density of the semiconductor layer 40 and the hump phenomenon.

The threshold value $V_{th}$ of the thin-film transistor 10 can be expressed by the following equations in consideration with the influences of the fixed charges at the back channel side (protective layer side) of the semiconductor layer 40 (the amorphous silicon semiconductor layer 5).

$$V_{th} = V_{FB} + 2\phi_B + \gamma\sqrt{2\phi_B - Q_{bk}/C_{ox}} \quad [\text{Math 1}]$$

$$\gamma = \frac{\sqrt{2\varepsilon_{Si}qN_A}}{C_{ox}}$$

Here, $V_{FB}$ represents flat band voltage, $\phi_B$ represents Fermi potential, $Q_{bk}$ represents the amount of fixed charges at the back channel side of the semiconductor layer 40, $\gamma$ represents body effect coefficient, $N_A$ represents impurity concentration of the semiconductor layer 40, $C_{OX}$ represents capacitance of the gate insulating layer 3, $\varepsilon_{Si}$ represents permittivity of the semiconductor layer 40 (Si), and q represents elementary charge.

According to the γ in the above equation, influences of the fixed charges at the back channel side is stronger in a thin-film transistor which includes the semiconductor layer 40 with a higher impurity concentration ($N_A$). Here, the semiconductor layer 40 with a high defect density also has a high impurity concentration. Hence, it can be said that the effect at the back channel side is stronger in a thin-film transistor which includes the semiconductor layer 40 with a high defect density.

On the other hand, a thin-film transistor, which includes the semiconductor layer 40 having a low defect density, is not likely to be influenced by the back channel side. Hence, even when the non-altered layer 61 and the altered layer 62 in the protective layer 6 have different amount of fixed charges in the thin-film transistor which includes the semiconductor layer 40 having a low defect density, influence on the threshold value $V_{th}$ is small, which is not likely to cause the hump phenomenon. As described, since the degree of the hump phenomenon varies depending on the defect density of the semiconductor layer 40, occurrence of the hump phenomenon can be reduced by adjusting the defect density of the semiconductor layer 40 as desired.

In such a manner, the inventors found out that the hump phenomenon can be reduced by adjusting the taper angle of the protective layer 6 and the defect density of the semiconductor layer 40 as desired. The present invention is conceived based on the above finding. Hereinafter, a specific description is given of the relationship between the taper angle of the protective layer 6 and the defect density of the semiconductor layer 40 which can reduce the hump phenomenon.

Figure 9:
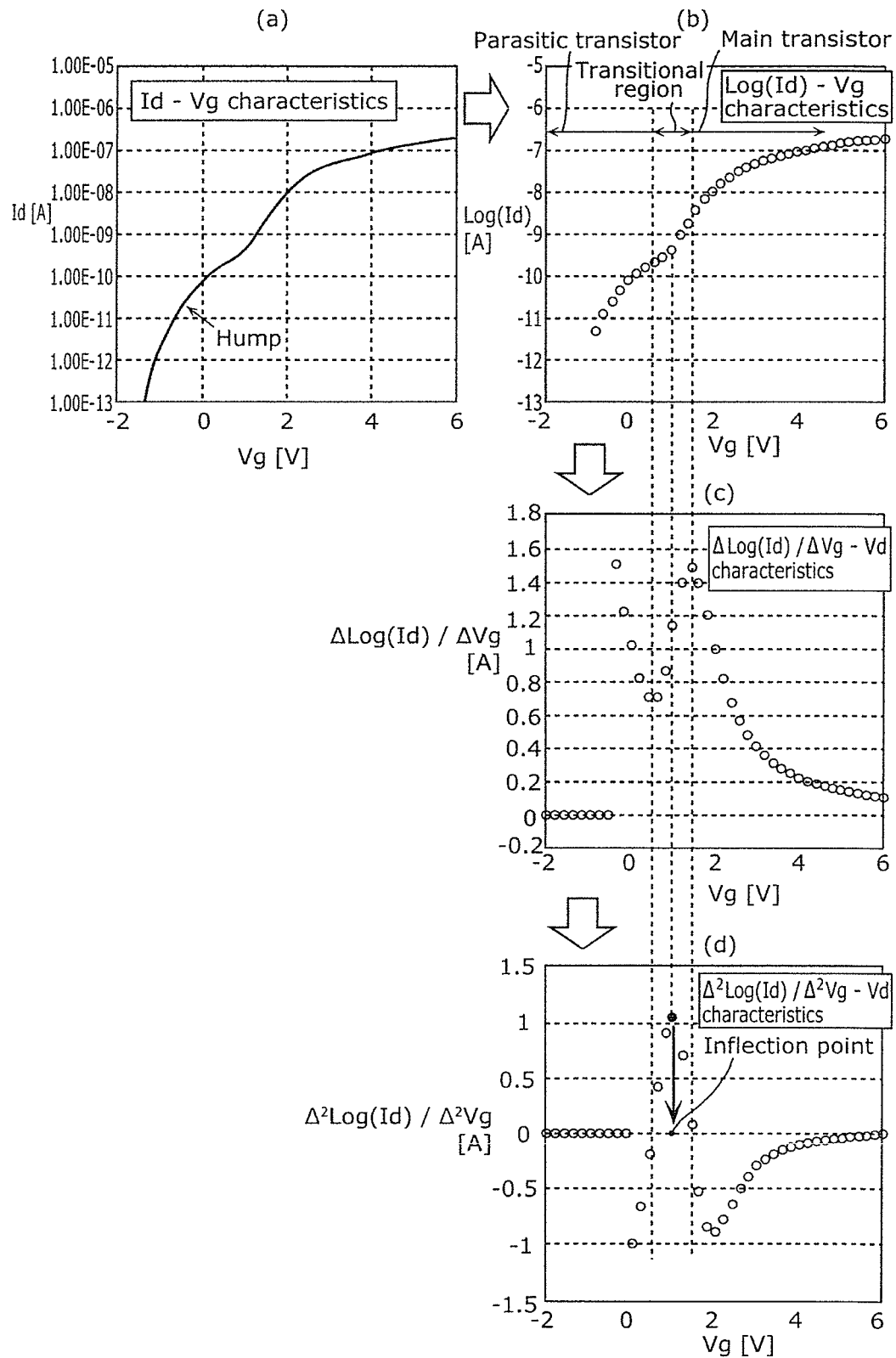
FIG. 9 illustrates a method for calculating the amount of hump in the thin-film transistor.

Here, in this embodiment, the hump phenomenon is quantified and the degree of the hump phenomenon is evaluated as the amount of hump. First, referring to FIG. 9, a description is given of a method for calculating the hump amount. FIG. 9 illustrates a method for calculating the hump amount in a thin-film transistor.

For example, in the case where the thin-film transistor has Id–Vd characteristics as shown in (a) in FIG. 9, first, the drain current Id is replaced with Log(Id) to obtain the Log(Id)–Vg characteristics as shown in (b) in FIG. 9. Next, as shown in (c) in FIG. 9, $\Delta$ Log(Id)/$\Delta$Vg–Vg characteristics is obtained by differentiating Log(Id). Furthermore, as shown in (d) in FIG. 9, $\Delta^2$ Log(Id)/$\Delta^2$Vg–Vg characteristics is obtained by differentiating $\Delta$ Log(Id)/$\Delta$Vg. The value of the $\Delta^2$ Log(Id)/$\Delta^2$Vg thus obtained is determined as the hump amount. Note that Vg corresponding to the hump amount here is determined as an inflection point.

Figure 10:
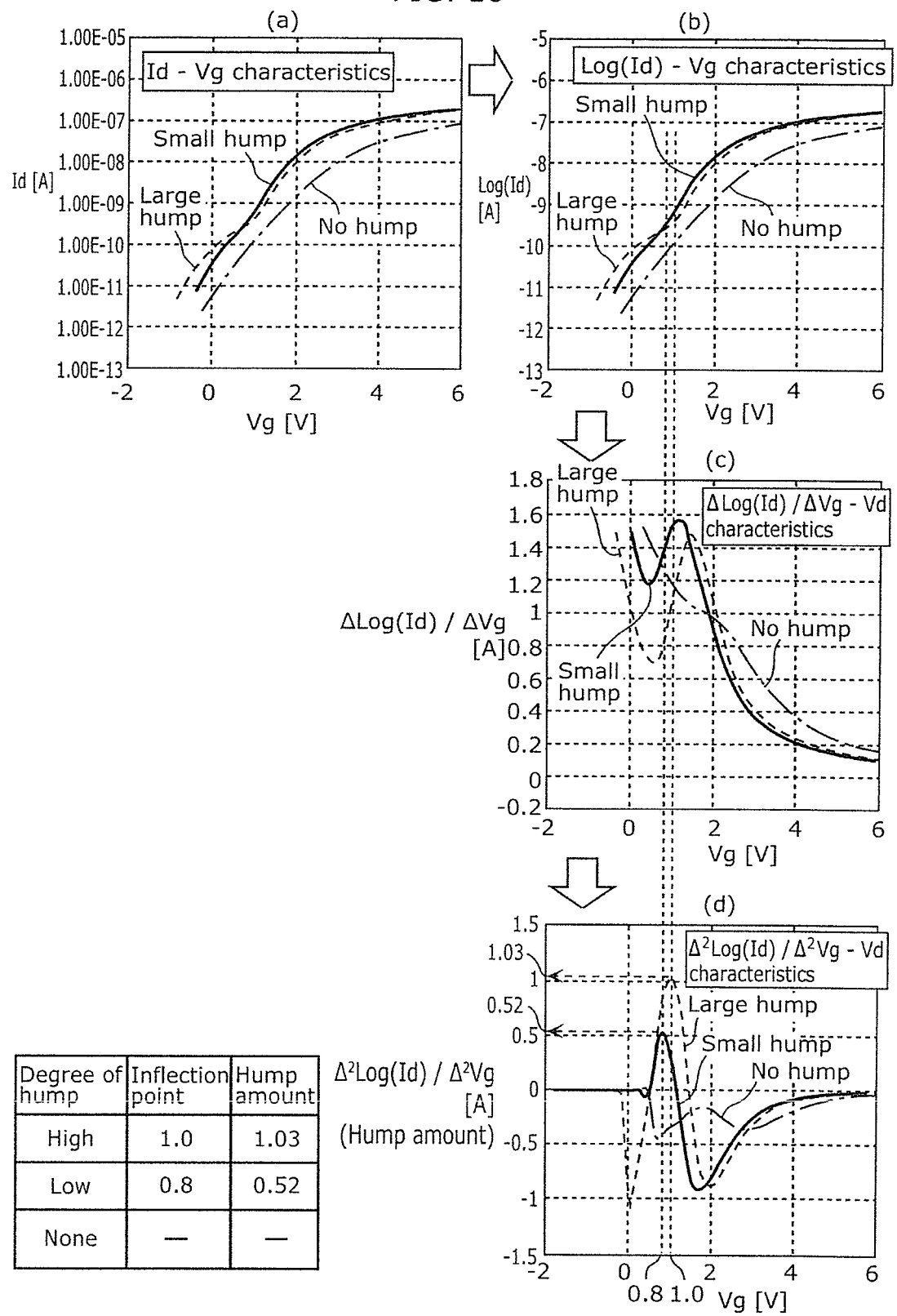
FIG. 10 shows a method for calculating the hump amount in three thin-film transistors having different degrees of hump and the calculated hump amount.

With the calculating method, the hump amounts of three thin-film transistors having different degrees of hump were calculated. FIG. 10 shows a method for calculating the hump amount in three thin-film transistors having different degrees of hump and the calculated hump amount.

First, as shown in (a) in FIG. 10, the Id–Vd characteristics of the three thin-film transistors having different degrees of hump were obtained. The three thin-film transistors are: a thin-film transistor with large hump phenomenon (higher degree of hump) ("large hump"); a thin-film transistor with small hump phenomenon (lower degree of hump) ("small hump"); and a thin-film transistor with no hump phenomenon ("no hump").

The hump amounts were calculated in the similar manner to the method shown in FIG. 9. More specifically, first, the drain current Id is replaced with Log (Id), and the Log(Id)–Vg characteristics are obtained as shown in (b) in FIG. 10. Next, as shown in (c) in FIG. 10, $\Delta$ Log(Id)/$\Delta$Vg–Vg characteristics is obtained by differentiating Log(Id). Next, as shown in (d) in FIG. 10, $\Delta^2$ Log(Id)/$\Delta^2$Vg–Vg characteristics is obtained by differentiating $\Delta$ Log(Id)/$\Delta$Vg. Here, $\Delta^2$ Log(Id)/$\Delta^2$Vg is the hump amount.

The results show that the thin-film transistor with a higher degree of hump (large hump) has a hump amount of 1.03 when the inflection point is 1. The results also show that the thin-film transistor with a lower degree of hump (small hump) has a hump amount of 0.52 when the inflection point is 0.8.

Figure 11A:
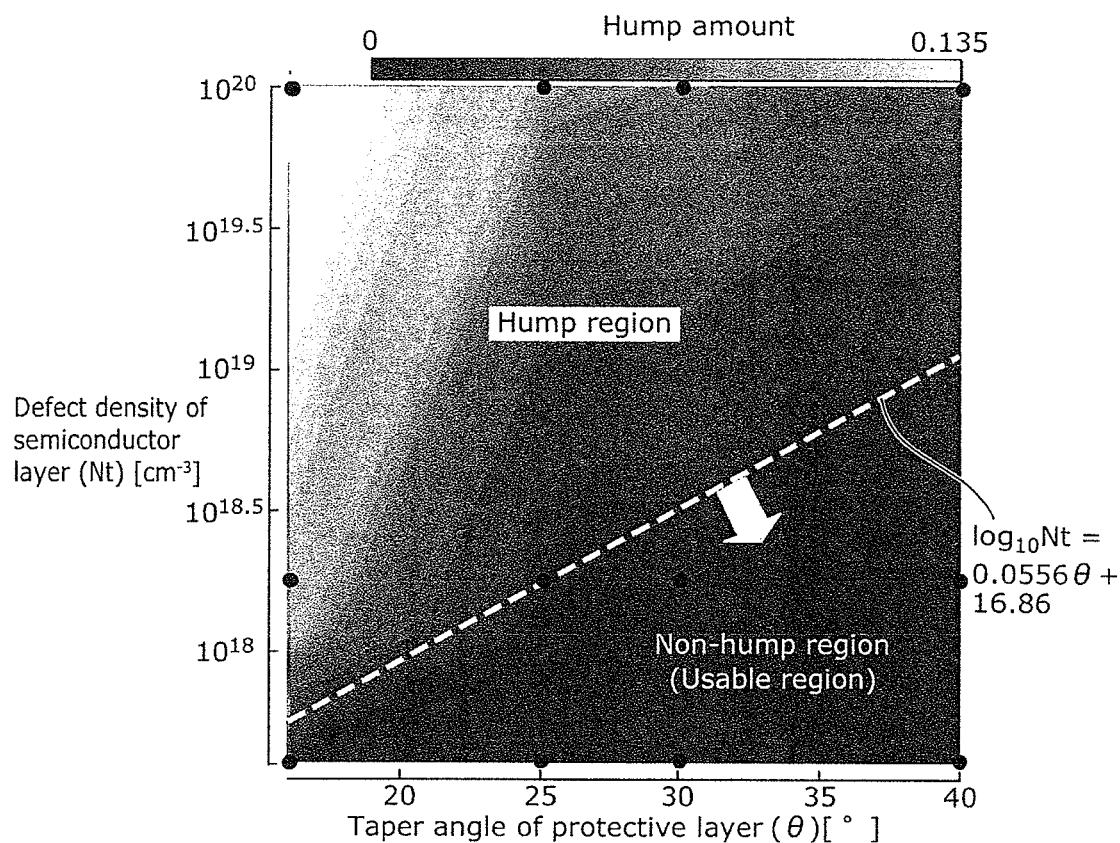
FIG. 11A shows a relationship among the taper angle of the protective layer, defect density of the semiconductor layer, and the hump amount in the thin-film transistor.

Next, twelve thin-film transistors, which include the protective layers 6 with different taper angles θ and the semiconductor layers 40 with different defect densities, were actually manufactured and the hump amount of each thin-film transistor was calculated by the calculating method as a measured value. FIG. 11A is a graph into which the measured values of the hump amount are mapped, and shows relationship among the taper angle of the protective layer, the defect density of the semiconductor layer, and the hump amount. In FIG. 11A, twelve black dots denote the measured values.

In this embodiment, the region where no hump phenomenon occurs (non-hump region) in FIG. 11A is used as the region where thin-film transistors can be used (usable region). In this embodiment, the "region where no hump phenomenon occurs" is defined as a region where the hump amount is at most 0.01 in consideration of measurement error and calculation error. Hence, the region where the hump amount exceeds 0.01 is the region where hump phenomenon occurs (hump region).

Figure 11B:
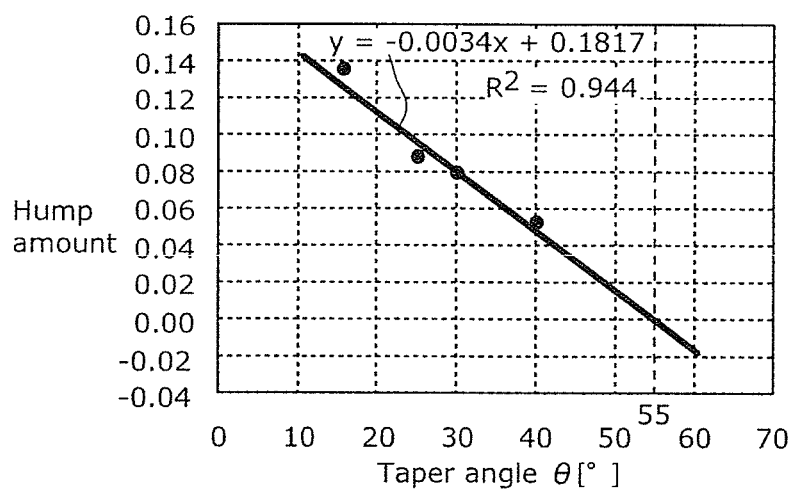
FIG. 11B is a graph obtained by extracting the relationship between four measured values of the hump amount and the taper angle of the protective layer when the defect density of the semiconductor layer is $1 \times 10^{20}$ cm$^{-3}$.

In order to determine the boundary between the hump region and the non-hump region, the boundary line between the hump region and non-hump region was calculated based on (i) the measured values obtained when the protective layer 6 has a taper angle θ of 25 degrees and the semiconductor layer 40 has a defect density of $1 \times 10^{18.25}$ cm$^{-3}$ and (ii) the calculated values obtained as described below (when the protective layer 6 has a taper angle θ of 55 degrees and the semiconductor layer 40 has a defect density of $1 \times 10^{20}$ cm$^{-3}$). Here, referring to FIG. 11B, a description is given of obtainment of the calculated values. FIG. 11B is a graph obtained by extracting the relationship between four measured values of the hump amount and the taper angle of the protective layer where the defect density of the semiconductor layer is $1 \times 10^{20}$ cm$^{-3}$.

As in FIG. 11B, by obtaining the approximation line based on the four measured value obtained when the semiconductor layer has a defect density of $1 \times 10^{20}$ cm$^{-3}$ in FIG. 11A, it is shown that the protective layer 6 has a taper angle θ of 55 degrees when the hump amount is 0. Since the correlation coefficient $R^2$ here is 0.944 which is a significantly high value, it is understood that the above approximation line is appropriate.

Next, the boundary line between the hump region and non-hump region is calculated, with the defect density of the semiconductor layer 40 being Nt (cm$^{-3}$), based on the measured values (obtained when the protective layer 6 has a taper angle θ of 25 degrees and the semiconductor layer 40 has a defect density of $1 \times 10^{18.25}$ cm$^{-3}$) and the calculated values (obtained when the protective layer 6 has a taper angle θ of 55 degrees and the semiconductor layer 40 has a defect density of $1 \times 10^{20}$ cm$^{-3}$). The boundary line thus calculated is $\mathrm{Log}_{10}$ Nt=0.0556θ+16.86. From the above, in FIG. 11A, the region where $\mathrm{Log}_{10}$ Nt≤0.0556θ+16.86 is determined as the non-hump region.

The followings will describe the reasons why occurrence of the hump phenomenon can be reduced by defining the defect density (Nt) of the semiconductor layer 40 and the taper angle (θ) of the protective layer 6 in the above manner.

As described above, the hump phenomenon is considered to occur due to the presence of the parasitic transistor caused by the altered layer 62. However, by making the defect density (Nt) of the semiconductor layer 40 and the taper angle (θ) of the protective layer 6 satisfy the above relationship, threshold voltage shift of the parasitic transistor to a higher value is performed. With this, the influence of the parasitic transistor can be hidden in the main transistor, thereby preventing the hump phenomenon from occurring in the Id-Vg characteristics.

As described above, in the thin-film transistor 10 according to the embodiment of the present invention, the defect density (Nt) of the semiconductor layer 40 and the taper angle (θ) of the edge portion of the protective layer 6 satisfy the relational expression of $\text{Log}_{10} \text{Nt} \leq 0.0556\theta + 16.86$. This leads to a thin-film transistor with no hump phenomenon.

In particular, in this embodiment, it is possible to resolve hump phenomenon that occurs in the region where current rapidly increases in the current-voltage characteristics of the conventional technique. With this, use of the thin-film transistor 10 according to this embodiment as a driving transistor of the organic EL display improves characteristics in a low gray scale region (black display region) in a display device.

(Variation)

Figure 12:
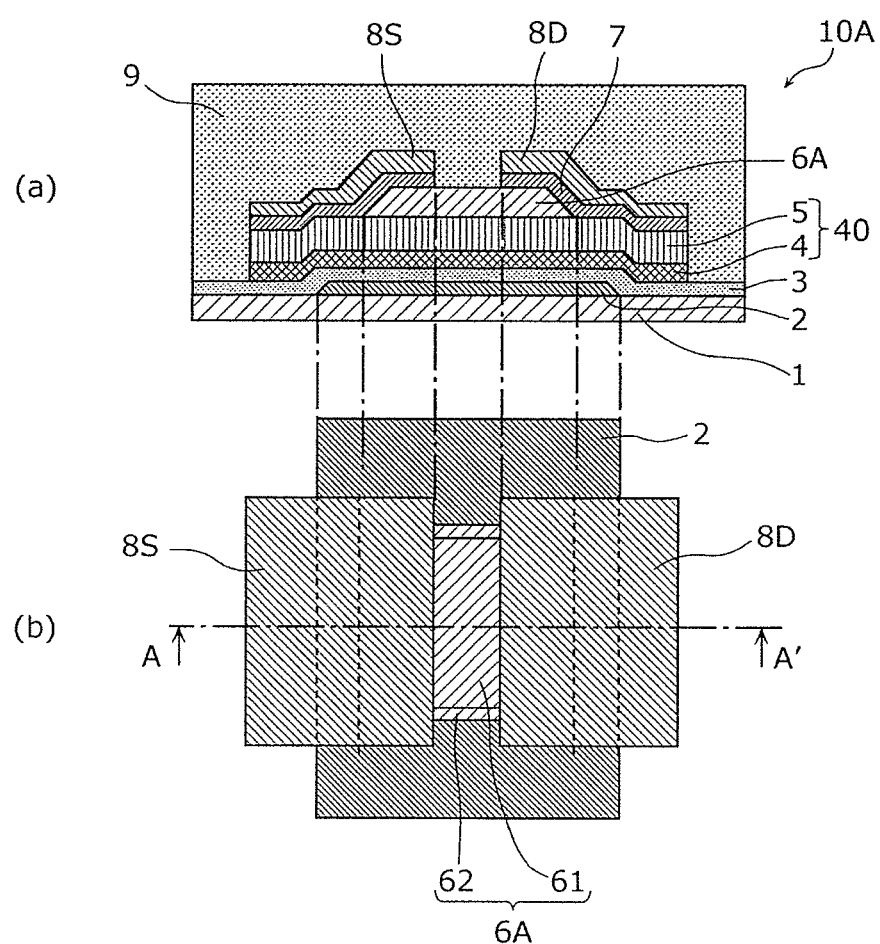
FIG. 12 schematically shows a configuration of a thin-film transistor according to Variation of the embodiment of the present invention.

Next, referring to FIG. 12, a description is given of a thin-film transistor 10A according to Variation of the embodiment of the present invention. FIG. 12 schematically shows a configuration of a thin-film transistor according to Variation of the embodiment of the present invention. In FIG. 12, (a) shows a cross-sectional view of the thin-film transistor taken along line A-A' in (b), and (b) shows a perspective plan view of the thin-film transistor.

As shown in FIG. 12, the thin-film transistor 10A according to Variation has a protective layer 6A which does not protrude from the source electrode 8S and the drain electrode 8D in the gate width direction. More specifically, in the thin-film transistor 10 according to the embodiment, the protective layer 6 protrudes from the source electrode 8S and the drain electrode 8D. In the thin-film transistor 10A according to Variation, the protective layer 6A does not protrude from the source electrode 8S and the drain electrode 8D. The lateral side of the protective layer 6A in the gate width direction recedes from the lateral side of the source electrode 8S and the drain electrode 8D in the gate width direction. The other structural elements are similar to those in the embodiment shown in FIG. 1.

The thin-film transistor 10A according to Variation produces the advantageous effects similar to those of the thin-film transistor 10 according to the above embodiment.

(Others)

Although the thin-film transistor and the method for manufacturing the thin-film transistor according to the present invention have been described based on the above embodiment and variation, the present invention is not limited to the embodiment and variation.

Those skilled in the art will readily appreciate that many modifications and combinations are possible in the exemplary embodiment and variation without materially departing from the novel teachings and advantages of the present invention. Accordingly, all such modifications and combinations are intended to be included within the scope of the present invention.

Figure 13:
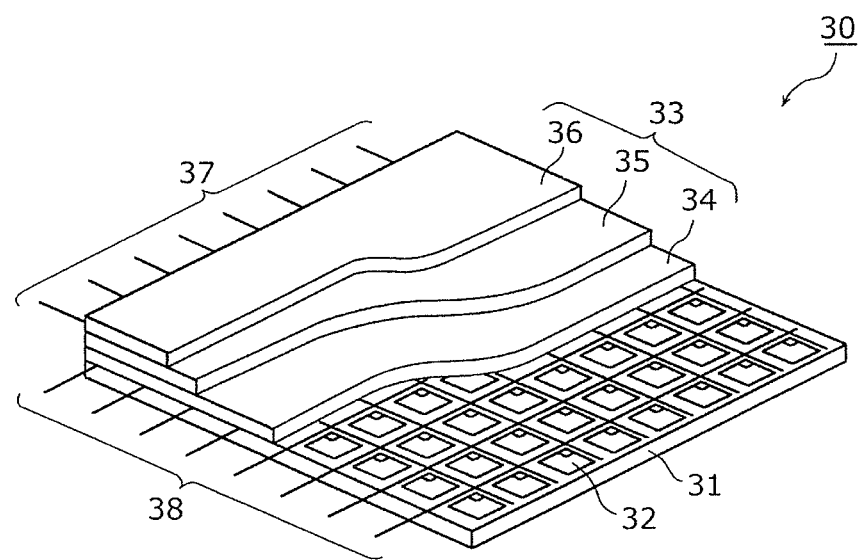
FIG. 13 is a partially cut perspective view of an organic EL display device according to the embodiment of the present invention.

Furthermore, the thin-film transistor according to this embodiment may be used as a display device, such as an organic EL display device, or a liquid crystal display device. For example, referring to FIG. 13, a description is given of an example where the thin-film transistor 10 according to the embodiment is applied to an organic EL display device. FIG. 13 is a partially cut perspective view of an organic EL display device according to the embodiment of the present invention.

As shown in FIG. 13, the organic EL display device 20 according to the embodiment includes: an active matrix substrate 21; a plurality of pixels 22 arranged in a matrix on the active matrix substrate 21; an organic EL device 23 formed corresponding to different one of the pixels 22; a plurality of gate lines 27 formed along a row direction of the pixels 22; a plurality of source lines 28 formed along a column direction of the pixels 22; and power lines 29 (not shown) formed in parallel with the source lines 28. The organic EL device 23 includes an anode 24, an organic EL layer 25, and a cathode 26 (transparent electrode) that are sequentially stacked on the active matrix substrate 21. The organic EL layer 25 includes a stack of an electron transport layer, an emission layer, a hole transport layer, and so on.

The thin-film transistor 10 according to this embodiment is provided as a switching transistor for selecting one of the pixels 22, but may be used as a driving transistor.

Figure 14:
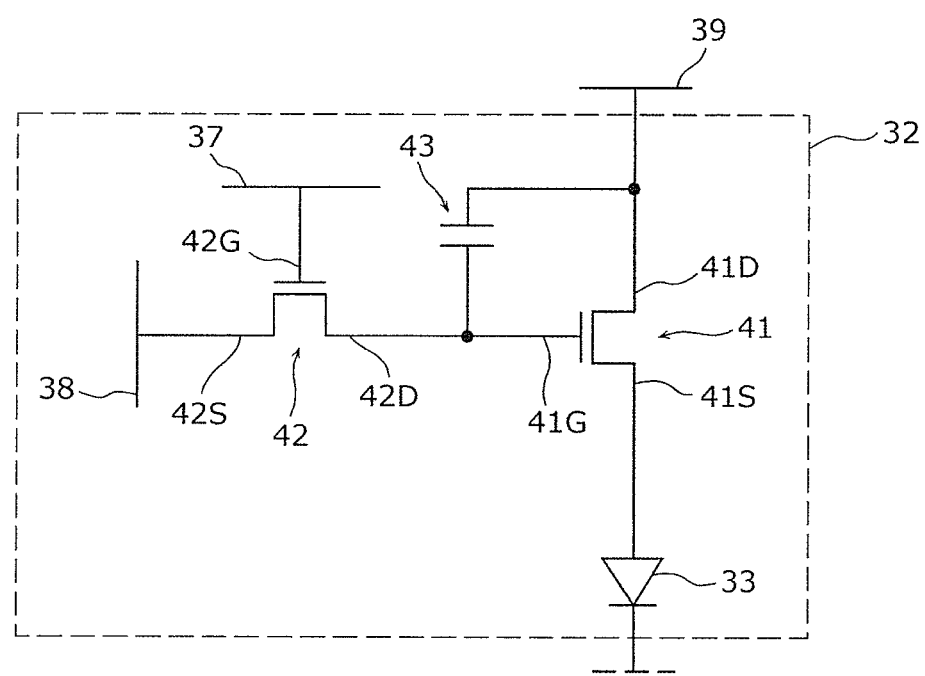
FIG. 14 shows a circuit configuration of a pixel which includes the thin-film transistor according to the embodiment of the present invention.

Next, referring to FIG. 14, a description is given of a circuit configuration of the pixel 22 in the organic EL display device 20. FIG. 14 shows a circuit configuration of a pixel which includes the thin-film transistor according to the embodiment of the present invention.

As shown in FIG. 14, each pixel 22 is partitioned by the gate line 27 and the source line 28 that are orthogonal to each other, and includes a driving transistor 31, a switching transistor 32, the organic EL device 23, and a capacitor 33. The driving transistor 31 is a transistor that drives the organic EL device 23. The switching transistor 32 is a transistor that selects the pixel 22.

In the driving transistor 31, a gate electrode 31G is connected to a drain electrode 32D of the switching transistor 32, a source electrode 31S is connected to the anode of the organic EL device 23 via a relay electrode (not illustrated), and a drain electrode 31D is connected to the power line 29.

In addition, in the switching transistor 32, the gate electrode 32G is connected to the gate line 27, the source electrode 32S is connected to the source line 28, and the drain electrode 32D is connected to the capacitor 33 and the gate electrode 31G of the driving transistor 31.

In this configuration, when a gate signal is input into the gate line 27 to turn on the switching transistor 32, the video signal voltage supplied via the source line 28 is written into the capacitor 33. The video signal voltage written into the capacitor 33 is held for a period of one frame. The held video signal voltage causes analog change in conductance of the driving transistor 31 and causes the driving current corresponding to luminescence gradation to flow from the anode to the cathode of the organic EL device 23. This causes organic EL device 23 to emit light. As a result, a predetermined image is displayed.

In addition, the display device such as the organic EL display device according to this embodiment can be used as a flat-panel display, and is applicable to electronic devices such as television sets, personal computers, or mobile phones.

INDUSTRIAL APPLICABILITY

The thin-film transistor according to an aspect of the present invention is widely applicable to display devices such as television sets, personal computers, and mobile phones, or various electronic devices having thin-film transistors.

REFERENCE SIGNS LIST

1 Substrate
2, 31G, 32G, Gate electrode
3 Gate insulating layer
4 Crystalline silicon semiconductor layer
4F Crystalline silicon semiconductor film
5 Amorphous silicon semiconductor layer
5F Amorphous silicon semiconductor film
6, 6A Protective layer
7 Contact layer
7F Contact layer film
8S, 31S, 32S Source electrode
8D, 31D, 32D Drain electrode
8F Source-drain metal film
9, Passivation layer 10, 10A, Thin-film transistor
20 Organic EL display device
21 Active matrix substrate
22 Pixel
23 Organic EL device
24 Anode
25 Organic EL layer
26 Cathode
27 Gate line
28 Source line
29 Power line
31 Driving transistor
32 Switching transistor
33 Capacitor
40 Semiconductor layer
40F Semiconductor film
61 Non-altered layer
62 Altered layer

The invention claimed is:

1. A thin-film transistor comprising:
a gate electrode above a substrate;
a gate insulating layer above the gate electrode;
a semiconductor layer that is opposed to the gate electrode with the gate insulating layer therebetween;
an etch-stopper layer above the semiconductor layer and comprising an organic material; and
a source electrode and a drain electrode that are opposed to each other, each of the source electrode and the drain electrode having at least a portion located above the etch-stopper layer;
wherein the etch-stopper layer includes an altered layer having at least a portion contacting the semiconductor layer, the altered layer being generated by alteration of a surface layer of the etch-stopper layer in a region exposed from the source electrode and the drain electrode, and
a relational expression of $Log_{10} Nt \leq 0.0556\theta+16.86$ is satisfied where Nt ($cm^{-3}$) represents a defect density of the semiconductor layer and $\theta$ (°) represents a taper angle of an edge portion of the region of the etch-stopper layer exposed from the source electrode and the drain electrode.

2. The thin-film transistor according to claim 1,
wherein the altered layer is a layer generated by dry etching performed to pattern the semiconductor layer.

3. The thin-film transistor according to claim 1,
wherein the altered layer has a thickness of at least 30 nm.

4. The thin-film transistor according to claim 2,
wherein the altered layer has a density higher than a density of a non-altered layer which is a portion of the etch-stopper layer that is not altered by the dry etching.

5. The thin-film transistor according to claim 4,
wherein the altered layer has a chlorine concentration which is at least ten times higher than a chlorine concentration of the non-altered layer.

6. The thin-film transistor according to claim 4,
wherein the altered layer has a carbon concentration which is at most one hundredth of a carbon concentration of the non-altered layer.

7. A method for manufacturing a thin-film transistor, the method comprising:
preparing a substrate;
forming a gate electrode above the substrate;
forming a gate insulating layer above the gate electrode;
forming a semiconductor film above the gate insulating layer;
forming, above the semiconductor film, an etch-stopper layer comprising an organic material;
forming a source electrode and a drain electrode that are opposed to each other, each of the source electrode and the drain electrode having at least a portion located above the etch-stopper layer; and
forming a semiconductor layer patterned, by performing dry etching on the semiconductor film;
wherein in the forming of a semiconductor layer, the dry etching (i) alters, into an altered layer, a surface layer of the etch-stopper layer in a region exposed from the source electrode and the drain electrode and (ii) etches the etch-stopper layer to have a taper angle at an edge portion of the exposed region, and
a relational expression of $Log_{10} Nt \leq 0.0556\theta+16.86$ is satisfied where Nt ($cm^{-3}$) represents a defect density of the semiconductor layer and $\theta$ (°) represents the taper angle.

8. The method for manufacturing the thin-film transistor according to claim 7,
wherein the altered layer has a thickness of at least 30 nm.

9. The method for manufacturing the thin-film transistor according to claim 7,
wherein the altered layer has a density higher than a density of a portion of the etch-stopper layer that is not altered by the dry etching.

10. The method for manufacturing the thin-film transistor according to claim 9,
wherein the altered layer has a chlorine concentration which is at least ten times higher than a chlorine concentration of the non-altered layer.

11. The method for manufacturing the thin-film transistor according to claim 9,
wherein the altered layer has a carbon concentration which is at most one hundredth of a carbon concentration of the non-altered layer.

* * * * *